(12) United States Patent
Ouchi

(10) Patent No.: US 6,876,275 B2
(45) Date of Patent: Apr. 5, 2005

(54) SURFACE ACOUSTIC WAVE DEVICE AND COMMUNICATION DEVICE CONTAINING THE SAME

(75) Inventor: Minefumi Ouchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 25 days.

(21) Appl. No.: 10/438,342

(22) Filed: May 15, 2003

(65) Prior Publication Data

US 2003/0227359 A1 Dec. 11, 2003

(30) Foreign Application Priority Data

May 15, 2002 (JP) .......................................... 2002-140711
Apr. 8, 2003 (JP) .......................................... 2003-103858

(51) Int. Cl.[7] ................................................ H03H 9/00
(52) U.S. Cl. ........................................ 333/193; 333/195
(58) Field of Search ................................ 333/133, 193, 333/195

(56) References Cited

U.S. PATENT DOCUMENTS 5,963,114 A * 10/1999 Ueda et al. .................. 333/195
6,291,924 B1 * 9/2001 Lau et al. .................... 310/313 R
6,498,548 B2 * 12/2002 Kaneda et al. ............... 333/195
6,583,691 B2 * 6/2003 Takamine .................... 333/195
6,650,206 B2 * 11/2003 Nakamura et al. ........... 333/193
6,720,847 B2 * 4/2004 Nako et al. .................. 333/193
2001/0013815 A1 * 8/2001 Sawada ....................... 333/133
2002/0021195 A1 2/2002 Takamine

FOREIGN PATENT DOCUMENTS

| EP | 1 227 584 A1 | 7/2002 |
| EP | 1 237 275 A2 | 9/2002 |
| EP | 1 289 135 A2 | 3/2003 |

* cited by examiner

Primary Examiner—Michael Tokar
Assistant Examiner—Linh V Nguyen
(74) Attorney, Agent, or Firm—Keating & Bennett, LLP

(57) ABSTRACT

A surface acoustic wave device includes a plurality of interdigital electrode portions provided so as to have a balanced-unbalanced conversion function. A ratio N2/N1 is the range of about 50% to about 70%, where N1 represents the total number of electrode fingers of an interdigital electrode portion connected on a balanced signal terminal side, and N2 represents the total number of electrode fingers of the interdigital electrode portion connected on the unbalanced signal side, and the meshing width (W) of the interdigital electrode portions is in the range of about 43 λ to about 58 λ in which λ is the wavelength of a surface acoustic wave.

22 Claims, 42 Drawing Sheets

RESONANCE MODE CORRESPONDING TO POINT B (ZERO-ORDER MODE)

RESONANCE MODE CORRESPONDING TO POINT A (SECOND MODE)

RESONANCE MODE CORRESPONDING TO POINT C

① 880MHz～895.5MHz

SURFACE ACOUSTIC WAVE DEVICE AND COMMUNICATION DEVICE CONTAINING THE SAME

BACKGROUND OF THE INVENTION

1. Field of the Invention

The present invention relates to a surface acoustic wave device which is suitably used as a filter in a small-sized radio communication device such as a portable telephone, and in particular to a surface acoustic wave device having a balanced-unbalanced conversion function of which the input-output impedances are different from each other, and a communication device including the same.

2. Description of the Related Art

In recent years, techniques for developing small-sized, light-weight radio communication devices, such as portable telephones, have progressed a great deal. In such devices, composite parts having plural functions have been developed to reduce the number of components in the device and the size thereof.

In the above-described background, surface acoustic wave filters for use in the RF stages of portable telephones have been required to have a balanced-unbalanced conversion function, the so-called balun function. Thus, longitudinally coupled resonator type surface acoustic wave filters which perform the balanced-unbalanced signal transformation have been primarily used for band-pass filters in the RF stages of portable telephones.

The longitudinally coupled resonator type surface acoustic wave filters having a balanced-unbalanced conversion function are often connected to mixer ICs provided with balanced or differential inputs-outputs (hereinafter, referred to as a balanced type mixer IC). Influences of noise are reduced, and the output is stabilized by using the balanced type mixer IC. Thus, the characteristics of portable telephones are improved. Therefore, balanced type mixer ICs have been widely used.

In most cases, the above-described balanced type mixer ICs have a high impedance of about 100 Ω to about 200 Ω, while surface acoustic wave filters used in the RF stages usually have an impedance of about 50 Ω. Balanced type mixer ICs having an impedance of 200 Ω are primarily used. Accordingly, for longitudinally coupled resonator type surface acoustic wave devices used with balanced type mixer ICs, one of the input and output impedances must be about four-times that of the other.

To attain such input-output impedances, the configuration disclosed in Japanese Unexamined Patent Application Publication No. 2001-267885, as shown in FIG. 28, is often used. In the configuration shown in FIG. 28, for each of longitudinally coupled resonator type surface acoustic wave elements 101 and 102, one terminal is electrically connected in parallel, and the others are connected in series.

The difference between the surface acoustic wave element 101 and the surface acoustic wave element 102 is that the phases of interdigital electrode portions (hereinafter referred to as IDT) 103 and 108 are inverted with respect to each other. Thus, the phases of the signals output through terminals 114 and 115 are different from each other by about 180°, such that an unbalanced signal input through a terminal 113 is converted to balanced signals which are output through the terminals 114 and 115.

FIG. 29 shows the frequency characteristic of the filter having the configuration of FIG. 28. FIGS. 30A and 30B show the impedance characteristics thereof. The impedance characteristic of FIG. 29 is that of the filter which is designed as an EGSM (Enhanced Global System for Mobile Communications) transmission filter. The frequency range that is required for the pass-band is from 880 MHz to 915 MHz. Points at f=880 MHz and f=915 MHz designated by X and Y, respectively, are plotted in FIGS. 30A and 30B, respectively.

As seen in FIGS. 30A and 30B, the filter is designed so as to have terminal impedances of 50 Ω on the unbalanced signal side (S11) and 200 Ω on the balanced signal side (S22). Thus, the impedances are substantially matched, such that the impedance on the balanced signal side is about four times the impedance on the unbalanced signal side.

On the other hand, some of the above-described balanced type mixer ICs have an impedance of about 100 Ω. Correspondingly, in some cases, the longitudinally coupled resonator type surface acoustic wave filter must have an impedance on the unbalanced signal terminal side that is about twice the impedance on the balanced signal terminal side.

Japanese Patent No. 3224202 discloses a filter corresponding to unbalanced-balanced input-output that is configured as shown in FIG. 31. The configuration of FIG. 31 will be described. Two longitudinally coupled resonator type surface acoustic wave elements 201 and 202 are connected to each other, in which IDT 204 of the element 201 and IDT 209 of the element 202 and also IDT 205 of the element 201 and IDT 210 of the element 202 are cascade connected to each other. A terminal 213 is an unbalanced signal terminal. A signal input through the terminal 213 is converted to signals having phases that are different from each other by about 180° in IDT 208, which are output through balanced signal terminals 214 and 215.

According to Japanese Patent No. 3224202, a desired characteristic is achieved by setting the meshing widths W of the surface acoustic wave elements 201 and 202 so as to be different from each other as shown in FIG. 31, even if the impedances on the unbalanced signal terminal side and on the balanced signal terminal side are different from each other.

However, the configuration of FIG. 31 cannot meet with the recent requirements such as a wide band, a low loss, and a high balancing degree. One of the reasons for this is that when the respective two surface acoustic wave elements 201 and 202 are cascade-connected to each other, the insertion loss is equal to the total of the insertion losses of the two elements. Moreover, since the meshing widths W in the first and second stages are different from each other, mismatching occurs between the stages. This increases the insertion loss.

By way of reference, FIG. 32 shows the frequency characteristic of one surface acoustic wave element. FIG. 33 shows the frequency characteristic of the two surface acoustic wave elements cascade-connected to each other. In the configuration of FIG. 31, the signals have phases that are different from each other by 180° in the IDT 208 and are output through the balanced signal terminals 214 and 215, respectively. However, the asymmetrical arrangement of the IDT electrodes and wirings on a substrate cannot be avoided. This affects the amplitude and phase-balance degree of the output signals. Thus, the balance degree is deteriorated as compared to that of the configuration of FIG. 28.

Accordingly, the configuration of FIG. 31 is unsuitable for a filter corresponding to unbalanced-balanced input-output which requires low-loss and a high level of balance. For such purposes, the configuration of FIG. 28 is used.

Hereinafter, the configuration of FIG. 28 will be described which includes an unbalanced signal terminal 113 provided on the input side, and balanced signal terminals 114 and 115 provided on the output side. In the configuration of FIG. 28, $R_i$ and $R_o$ represent the impedances of the input-output terminals of the surface acoustic wave elements 101 and 102, respectively. The impedance on the unbalanced signal terminal side is expressed by $R_i/2$, since the terminals on the input side of the surface acoustic wave elements 101 and 102 are electrically connected in parallel to each other. The impedance on the balanced signal terminal side is expressed by $2R_o$, since the terminals on the output side of the surface acoustic wave elements 101 and 102 are electrically connected in series with each other.

Ordinarily, when each of the surface acoustic wave elements 101 and 102 includes three IDTs, the impedances of the input and output terminals are approximately the same, such that $R_i \approx R_o$. To form an unbalanced-balanced input-output filter in which the impedance on the balanced signal terminal side is about four times the impedance on the unbalanced signal terminal side, as described above, 4×Ri/2≈2Ro, that is, Ri≈Ro is required. This facilitates the design of the filter.

On the contrary, to form an unbalanced-balanced input-output filter in which the impedance on the balanced signal terminal side is about two times the impedance on the unbalanced signal terminal side, 2×Ri/2≈2Ro, that is, 2Ri≈Ro is required. Thus, it is necessary to produce the surface acoustic wave elements 101 and 102 such that $2R_i \approx R_o$. The design of the elements 101 and 102 is difficult.

According to one of the related art methods, a surface acoustic wave device element having an unbalanced-balanced transformation function in which the impedance on the balanced signal terminal side is about four times the impedance on the unbalanced signal terminal side is formed using surface acoustic wave elements with $R_i \approx R_o$. To match the impedances, matching elements are provided outside the surface acoustic wave device. That is, an inductance element is provided in parallel on the balanced signal terminal side, and a capacitance element is provided in series (alternatively, the capacitance element is provided in parallel, and the inductance element is provided in parallel), such that the impedance on the balanced signal terminal side is about two times the impedance on the unbalanced signal terminal side.

FIG. 34 shows the frequency characteristic obtained when the matching is performed such that the impedance on the unbalanced signal terminal side is two times the impedance on balanced signal terminal side. FIGS. 35A and 35B show the impedance characteristics (in the range of 880 MHz to 915 MHz). FIG. 36 shows a measuring circuit in which external elements are added. It is to be noted that in FIG. 34 and FIGS. 35A and 35B, the characteristics obtained when no external element is added are shown for comparison. As seen in FIG. 34 and FIGS. 35A and 35B, the impedance on the balanced signal terminal side can be set to be about two times the impedance on the unbalanced signal terminal side by the above-described method. However, problematically, the addition of external elements increases the number of components, and hinders the development of a small-sized surface acoustic wave device.

The above-described problems are caused when the impedance on the unbalanced terminal sides is three times the impedance on the balanced terminal side as well as when the impedance on the unbalanced terminal sides is two times the impedance on the balanced terminal side.

SUMMARY OF THE INVENTION

To overcome the problems described above, preferred embodiments of the present invention provide a surface acoustic wave device which includes a plurality of IDTs provided so as to have a balanced-unbalanced conversion function, wherein a ratio N2/N1 is in the range of about 50% to about 70%, in which N1 represents the total number of electrode fingers of an IDT connected on a balanced signal terminal side, and N2 represents the total number of electrode fingers of the IDT connected on the unbalanced signal side, and the meshing width (W) of the IDTs is in the range of about 43 λ to about 58 λ, where λ is the wavelength of a surface acoustic wave.

According to the above-described configuration, the ratio of the impedances on the unbalanced and balanced signal terminal sides is about 1:2 or about 1:3 without the addition of any further external elements. Thus, the configuration is simple.

Preferably, the distance between the centers of adjacent electrode fingers of an IDT adjacent to a reflector of the IDTs and the reflector is about 0.46 λr to about 0.54 λr, where λr is the wavelength determined by the electrode pitch of the reflector.

In the surface acoustic wave device, the ratio (f ref/f idt) is preferably in the range of about 0.993 to about 1.008, where f idt is a frequency depending on the electrode pitch of an IDT, and f ref is a frequency depending on the electrode pitch of a reflector.

The surface acoustic wave device preferably includes a first surface acoustic wave filter having an odd-number of IDTs that is at least three provided on a piezoelectric substrate along the propagation direction of a surface acoustic wave, and a second surface acoustic wave filter having the phase of an input signal is different from that of the output signal by about 180°, in which a terminal on one side of each of the first and second surface acoustic wave filters is electrically connected in parallel to define an unbalanced signal terminal, and a terminal on the other side is electrically connected in series to define a balanced signal terminal, whereby the device has a balanced-unbalanced conversion function.

In the surface acoustic wave device, IDTs in a number of [(k−1)/2] are preferably connected to the unbalanced signal terminal, and the IDTs in a number of {[(k−1)/2]+1} are preferably connected to the balanced signal terminals.

In the surface acoustic wave device, one surface acoustic wave filter provided on a piezoelectric substrate along the propagation direction of a surface acoustic wave preferably includes a first terminal at which the phase difference between an input signal and the output signal is about zero degrees and a second terminal at which the phase difference between an input signal and the output signal is about 180 degrees, and the first terminal and the second terminal are connected in series with each other, whereby the device has a balanced-unbalanced conversion function.

In the surface acoustic wave device, the IDTs may be provided in a longitudinally coupled resonator type filter having three interdigital electrode portions.

In the surface acoustic wave device, at least one surface acoustic wave resonator is preferably connected in series with at least one IDT connected on the balanced-signal terminal side. Thereby, the attenuation out of the pass band is greatly increased. Thus, the filter characteristic is greatly improved.

In the surface acoustic wave device, at least one surface acoustic wave resonator is preferably electrically connected in series with a terminal connected to at least the IDTs positioned at both ends so as to satisfy f1<f0<fN<f2, where, in the resonance modes of each IDT, f0 is a zero-order mode excitation frequency, fN is an excitation frequency of a standing wave resonance mode having a peak in the intensity distribution of a surface acoustic wave between IDTs, f1 is a resonance frequency of the surface acoustic wave resonator, and f2 is an anti-resonance frequency.

In the surface acoustic wave resonator, preferably, the ratio of the impedances on the unbalanced and balanced signal terminal sides is preferably about 1:2 or about 1:3.

According to another preferred embodiment of the present invention, a communication device is provided which includes the above-described surface acoustic wave device.

As described above, a surface acoustic wave device having a ratio of the impedances on the unbalanced and balanced terminal sides of about 1:2 or about 1:3 is provided by setting the ratio N1/N2 (N1 represents the total number of the electrode fingers of IDTs connected on the balanced signal terminal side, and N2 represents the total number of the electrode fingers of IDTs connected on the balanced signal terminal side) in the range of about 50% to about 70%, and the meshing width (W) of the electrodes of the IDTs is set in the range of about 43 λ to about 58 λ (λI represents the wavelength of a surface acoustic wave, and more preferably by setting the IDT-reflector gap in the range of about 0.46 λr to about 0.54 λr, or the frequency ratio f ref/f idt in the range of about 0.993 to about 1.003.

Moreover, the ratio of the impedances on the unbalanced and balanced signal terminal sides is preferably about 1:2 or about 1:3 by electrically connecting one surface acoustic wave resonator in series with IDT which is connected to at least the balanced signal side terminal.

That is, the surface acoustic wave device is provided with a balanced-unbalanced conversion function in addition to a filter function. Moreover, the ratio of the impedances on the unbalanced and balanced signal terminal sides is preferably about 1:2 or about 1:3. The device has a sufficient attenuation out of the pass band. Thus, the communication device of the present invention has a greatly improved transmission characteristic.

Other features, elements, characteristics and advantages of the present invention will become more apparent from the following detailed description of the present invention with reference to preferred embodiments thereof with reference to the attached drawings.

DESCRIPTION OF THE PREFERRED EMBODIMENTS

Preferred embodiments of the surface acoustic wave device and the communication device equipped with the same of the present invention will be described with reference to FIGS. 1 to 27 and FIGS. 37 to 42.

Figure 1:
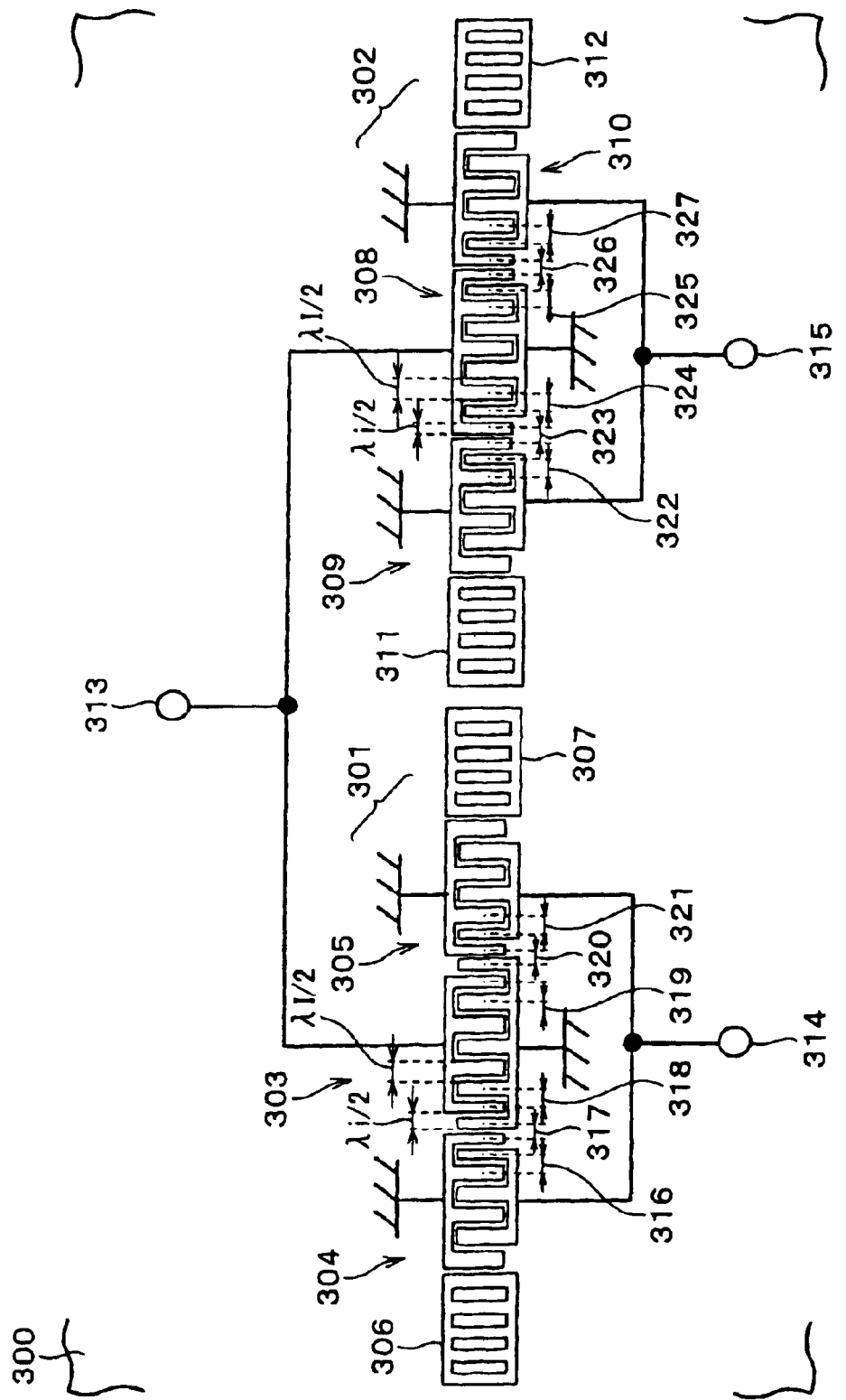
FIG. 1 shows a surface acoustic wave device according to a first preferred embodiment of the present invention.

According to a first preferred embodiment of the surface acoustic wave device of the present invention, a filter for EGSM transmission is configured such that the terminal impedance on the unbalanced signal terminal 313 side is about 50 Ω, and the terminal impedance on the side of the balanced signal terminals 314 and 315 is about 100 Ω, that is, the impedance on the balanced signal terminal side is about two times the impedance on the unbalanced signal terminal side, as shown in FIG. 1. The frequency range required for the pass-band of the EGSM filter is 880 MHz to 915 MHz, and the center frequency is 897.5 MHz.

According to the first preferred embodiment of the present invention, the surface acoustic wave filter is formed preferably using Al electrodes on a piezoelectric substrate 300 made of 40±5° Y-cut X-propagation LiTaO$_3$. The configuration of the first preferred embodiment will be described in detail. A longitudinally coupled resonator type surface acoustic wave element 301 is provided in which IDTs 304 and 305 are provided on the right and left sides of IDT 303, and reflectors 306 and 307 are arranged on the right and left sides of the IDTs 304, 303, and 305 so as to sandwich these IDTs.

Similarly, a longitudinally coupled resonator type surface acoustic wave element 302 is provided in which IDTs 309 and 310 are provided on the right and left sides of IDT 308, and reflectors 311 and 312 are arranged so as to sandwich the IDTs 304, 303, and 305. In this case, the phase of the longitudinally coupled resonator type surface acoustic wave element 302 is 180° different from that of the longitudinally coupled resonator type surface acoustic wave element 301.

The pitches of the electrode fingers (small pitch electrodes) in a portion of the respective IDTs 303, 304, 305, 308, 309, and 310 are preferably less than the pitches of the electrode fingers in another portion of the IDTs. In FIG. 1, the number of electrode fingers is decreased for simplification of the drawing. A terminal 313 is an unbalanced signal terminal, and terminals 314 and 315 are balanced signal terminals.

Referring to the configuration of FIG. 1, W($\mu$m) is a meshing width of the surface acoustic wave elements 301 and 302, $\lambda$I($\mu$m) is a wavelength determined by the pitch of IDT, and W/$\lambda$I is the ratio of the meshing width to the wavelength. Moreover, N1 is the total number of the electrode fingers of the IDTs 303 and 308 connected to the unbalanced signal terminal 313, N2 is the total number of the electrode fingers of the IDTs 304, 305, 309, and 310 connected to the balanced signal terminals 314 and 315, respectively, and then N2/N1(%) (hereinafter, referred to as an electrode finger number ratio) is the ratio of the number of the electrode fingers of the unbalanced signal terminal 313 and the number of electrode fingers of the balanced signal terminals 314 and 315. Here the meshing width is defined as finger overlap.

Figure 2:
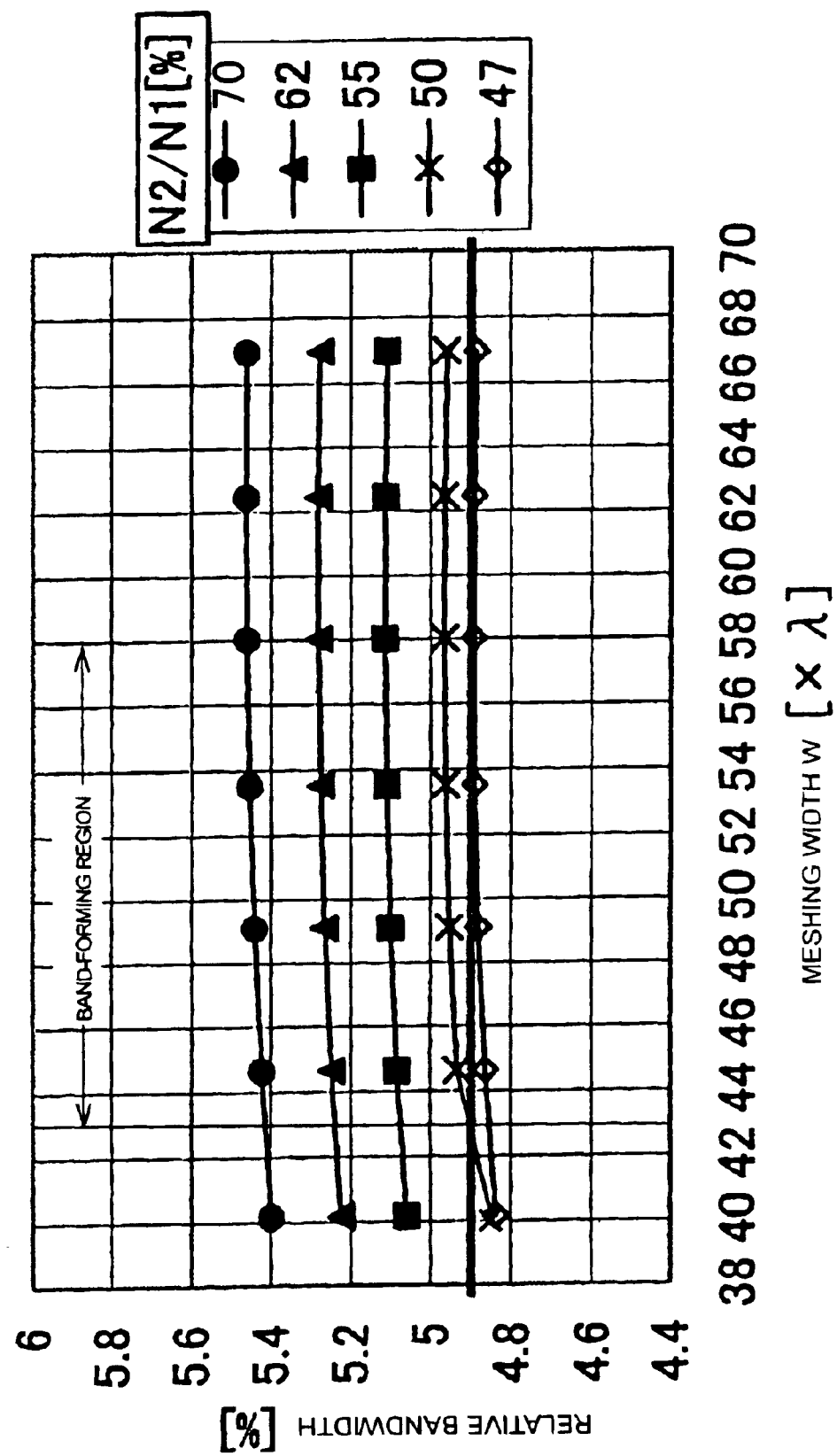
FIG. 2 is a graph, in which the meshing width W/λI in the first preferred embodiment is plotted on the X-axis, which shows the dependences of the relative bandwidth at different electrode finger ratios N2/N1.
Figure 3:
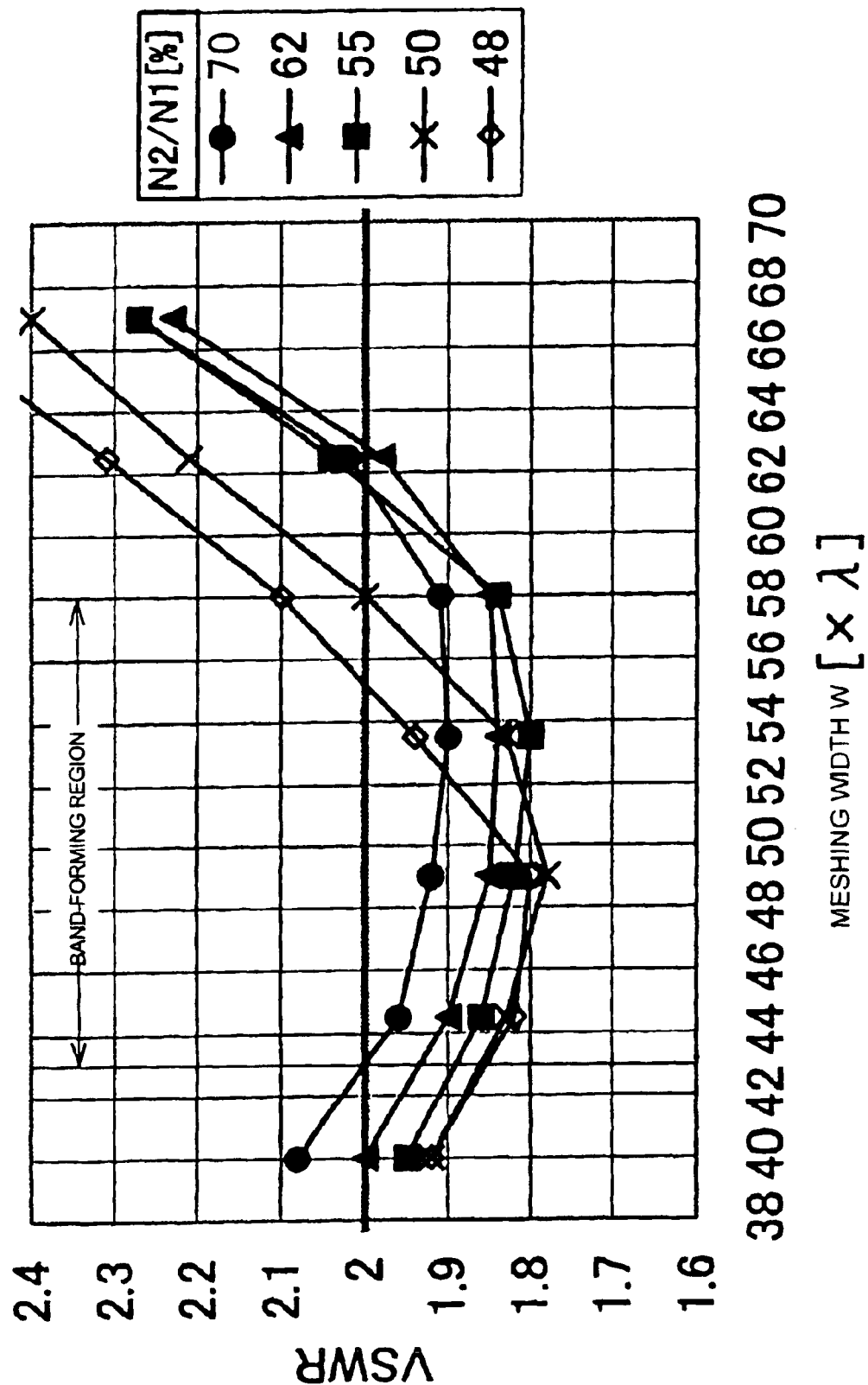
FIG. 3 is a graph, in which the meshing width W/λI in the first preferred embodiment is plotted on the X-axis, which shows the dependences of VSWR at different electrode finger ratios N2/N1.

FIGS. 2 and 3, in which the meshing width W/$\lambda$I is plotted on the X-axis, shows the dependency of the relative bandwidth, and VSWR (Voltage Standing Wave Ratio) at various electrode finger ratios N2/N1. In the case of the EGSM transmission filter, the required pass bandwidth is about 35 MHz. However, a bandwidth of about 44 MHz is required to account for a temperature-change margin and a production tolerance margin. That is, preferably, the relative bandwidth is at least 44 MHz/892.5 MHz=4.9%.

Preferably, the impedance in the pass-bandwidth is approximately equal to the terminal impedance. The reflection coefficient $\Gamma$ is $\Gamma=(ZL-Z0)/(Z1+Z0)$. VSWR is expressed by $(1+|\Gamma|)/(1-|\Gamma|)$. Accordingly, the VSWR is used as an index for the departure from the terminal impedance of the surface acoustic wave device. The VSWR must be no more than 2.0 (that is, up to 2.0) as required by the market.

As seen in FIG. 2, the required relative bandwidth of at least about 4.9% is satisfied in the range of the electrode finger ratio N2/N1 of about 50% and more, or in the range of the ratio N1/N2 of about 50% and the meshing width W of about 43$\lambda$I and more. Therefore, preferably, the electrode finger ratio N2/N1 is at least about 50%, and the meshing width W is at least about 43$\lambda$I.

Referring to FIG. 3, to satisfy the required VSWR of up to 2.0, the meshing width is preferably no more than about 58$\lambda$I, where the electrode finger ratio N2/N1 is at least about 50% as described above. Moreover, where the meshing width W is about 43$\lambda$I, the electrode finger ratio N2/N1 is preferably up to about 70%.

The required relative bandwidth of at least about 4.9% and the required VSWR of up to about 2.0 are satisfied when the electrode finger ratio N2/N1 is between about 50% and about 70%, and the meshing width is between about 43$\lambda$I and about 58$\lambda$I.

Figure 4:
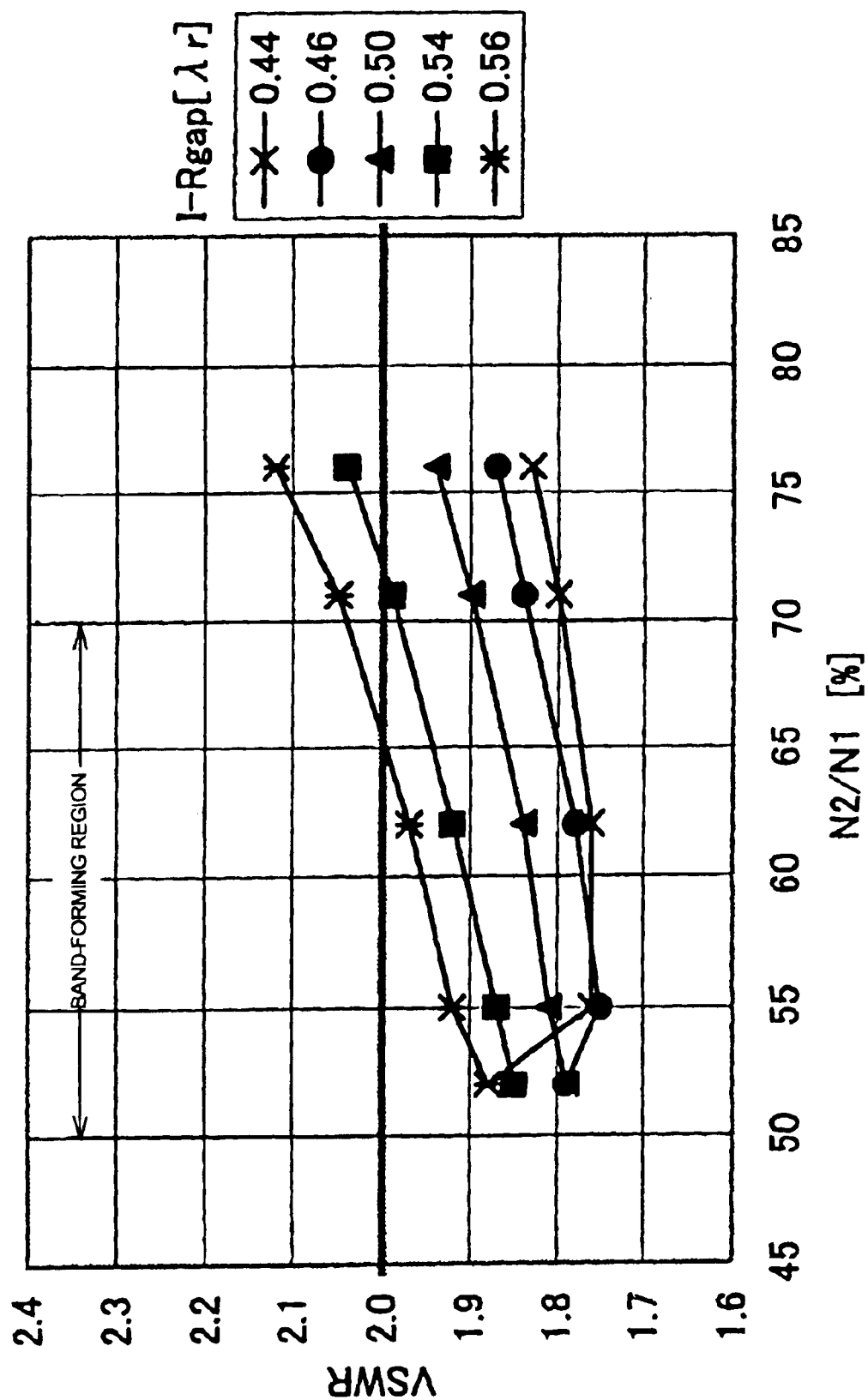
FIG. 4 is a graph, in which the electrode finger ratio N2/N1 in the first preferred embodiment is plotted on the X-axis, which shows the dependences of VSWR at different IDT-reflector gaps.
Figure 5:
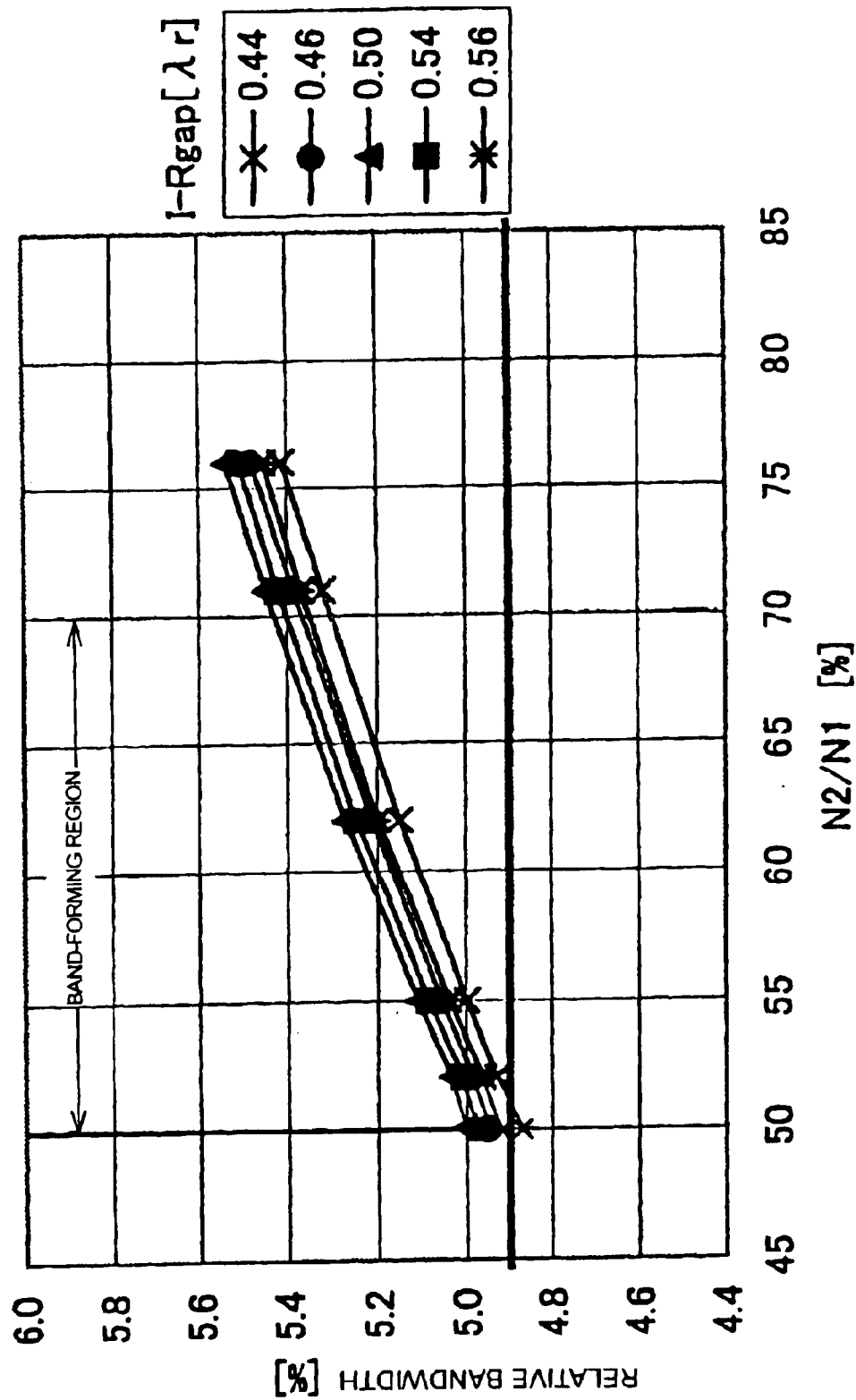
FIG. 5 is a graph, in which the electrode finger ratio N2/N1 in the first preferred embodiment is plotted on the X-axis, which shows the dependences of the relative bandwidth at different IDT-reflector gaps.

FIGS. 4 and 5, in which the electrode finger ratio N2/N1 is plotted on the X-axis, show the dependences of VSWR and the relative bandwidth at different IDT-reflector gaps (I-R gap($\lambda$r)),respectively. In this case, the meshing width W is constant, that is, about 50.5 $\lambda$I. As seen in FIG. 4, in the range of the electrode finger ratio N2/N1 of about 50% to about 70%, the VSWR is up to 2.0 when the IDT-reflector gap is up to about 0.54 $\lambda$r in which the $\lambda$r($\mu$m) is a wavelength determined by the pitch of a reflector. Moreover, referring to FIG. 5, the relative bandwidth is at least about 4.9% when the IDT-reflector gap is about 0.46 $\lambda$r.

Therefore, preferably, the IDT-reflector gap is between about 0.45 $\lambda$r and about 0.54 $\lambda$r in the range of the electrode finger ratio N2/N1 of about 50% to about 70%.

Figure 6:
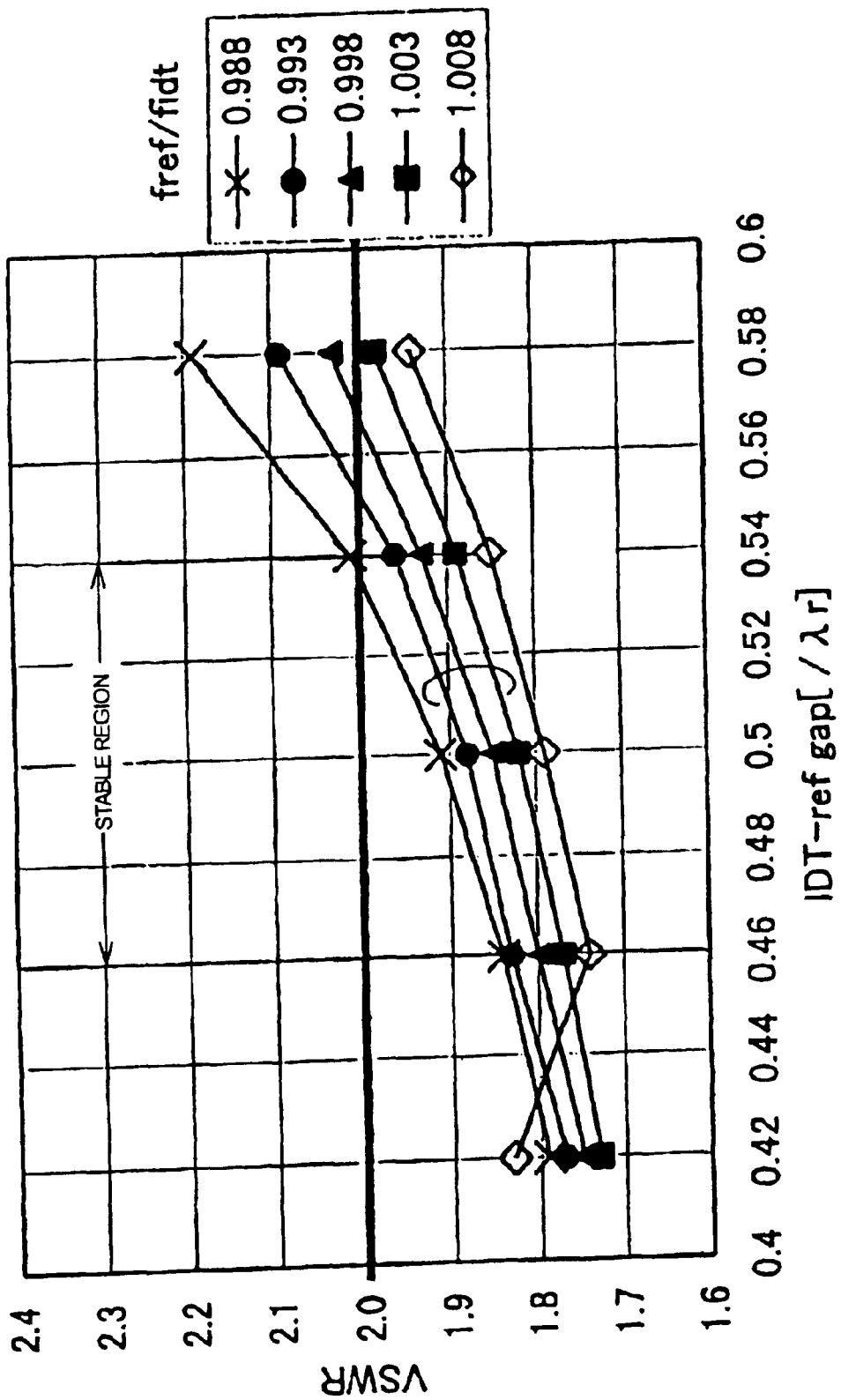
FIG. 6 is a graph, in which the IDT-reflector gap in the first preferred embodiment is plotted on the X-axis, which shows the dependences of VSWR at different frequency ratios f ref/f idt.
Figure 7:
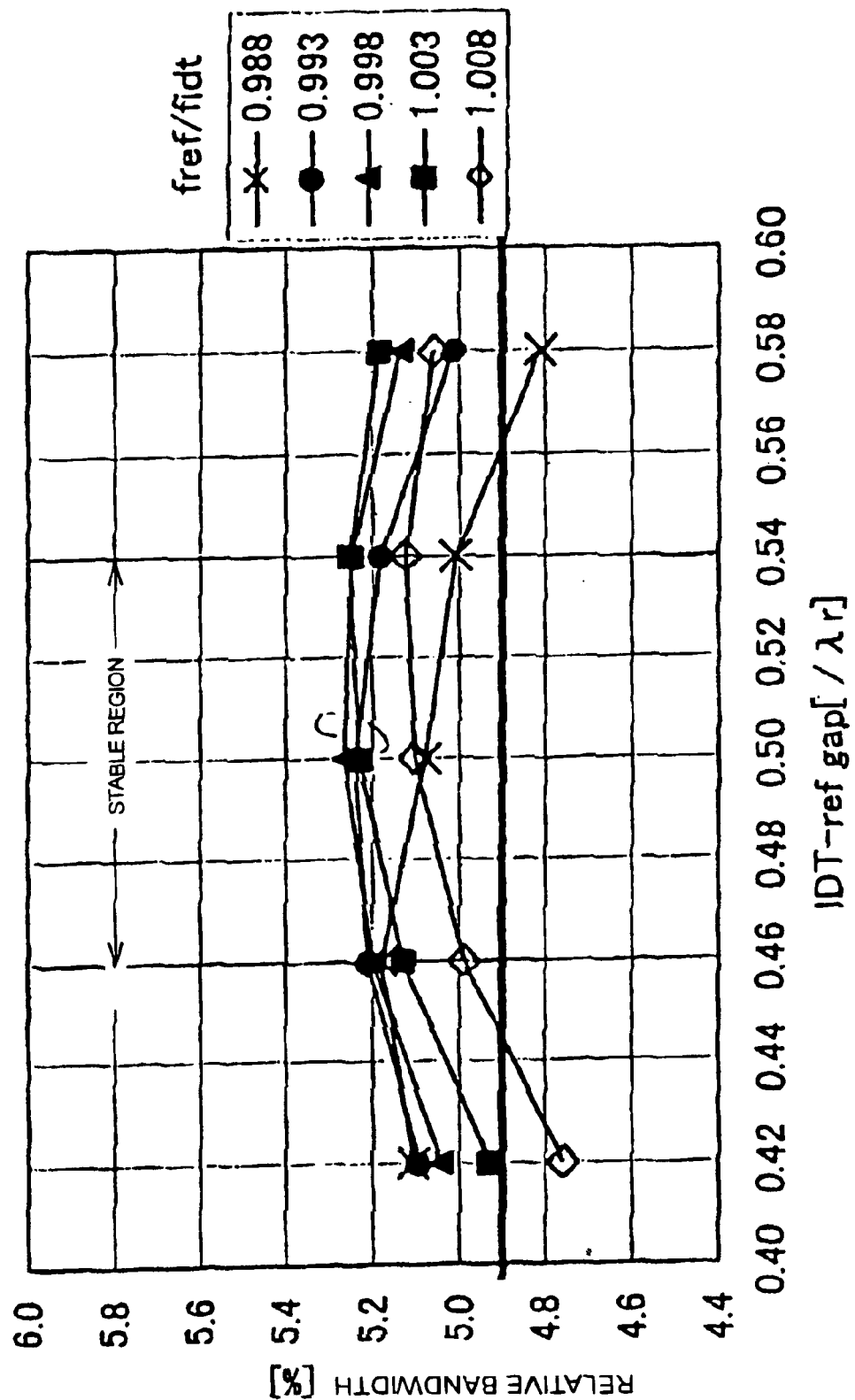
FIG. 7 is a graph, in which the IDT-reflector gap in the first preferred embodiment is plotted on the X-axis, which shows the dependences of the relative bandwidth at different frequency ratios f ref/f idt.

Then, f ref represents the frequency determined by the sound velocity and the pitch in a reflector, and f idt represents the frequency determined by the sound velocity and the pitch in IDT. Thus, f ref/f idt designates the ratio of the frequency in a reflector relative to that in IDT. FIGS. 6 and 7, in which the IDT-reflector gap is plotted on the X-axis, show the dependences of VSWR and the relative bandwidth at different frequency ratios f ref/f idt. In this case, the meshing width W is constant, that is, about 50.5 $\lambda$I, and also the electrode finger ratio N2/N1 is constant, that is, approximately 60%.

Referring to FIG. 6, there is a tendency for the VSWR to increase with an increase in the IDT-reflector gap. To satisfy the required VSER of up to about 2.0 in the range of the IDT-reflector gap of about 0.46 $\lambda$I to about 0.54 $\lambda$I, preferably, the frequency ratio f ref/f idt is between about 0.993 and about 1.008.

Referring to FIG. 7, the relative bandwidth has a tendency to change with the IDT-reflector gap in a parabolic line which is convex in the graph. In the range of the IDT-reflector gap of about 0.46 $\lambda$r to about 0.54 $\lambda$r, the relative bandwidth is most stable when the frequency ratio f ref/f idt is between about 0.993 and about 1.003. The curves of the relative bandwidth have a large slope outside of the above-defined region, and the characteristic changes greatly with the IDT-reflector gap, and thus, is unstable. Therefore, the frequency ratio f ref/f idt is preferably between about 0.993 and about 1.003.

Figure 8:
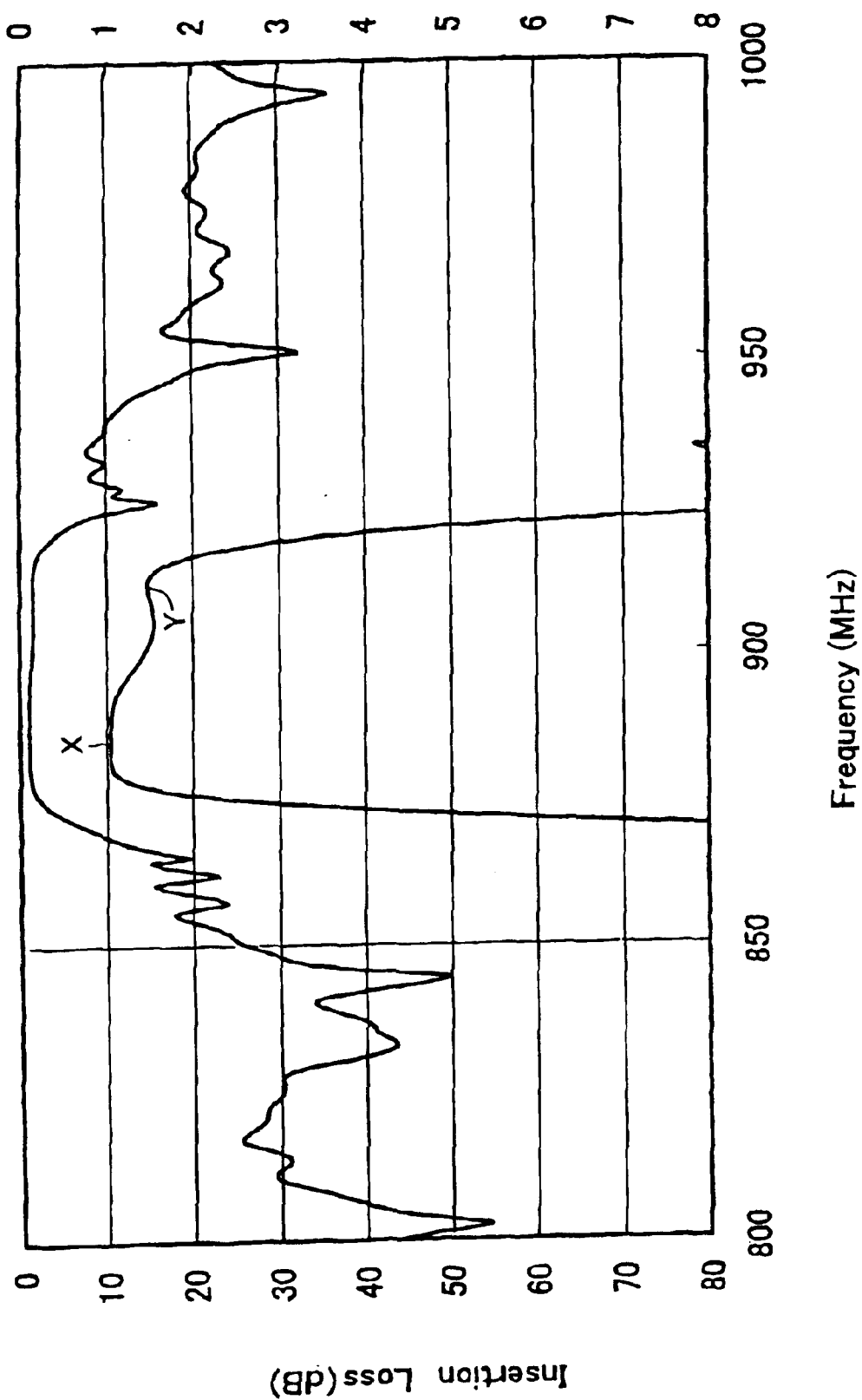
FIG. 8 is a graph showing the typical frequency characteristic in the first preferred embodiment of the present invention.
Figure 9B:
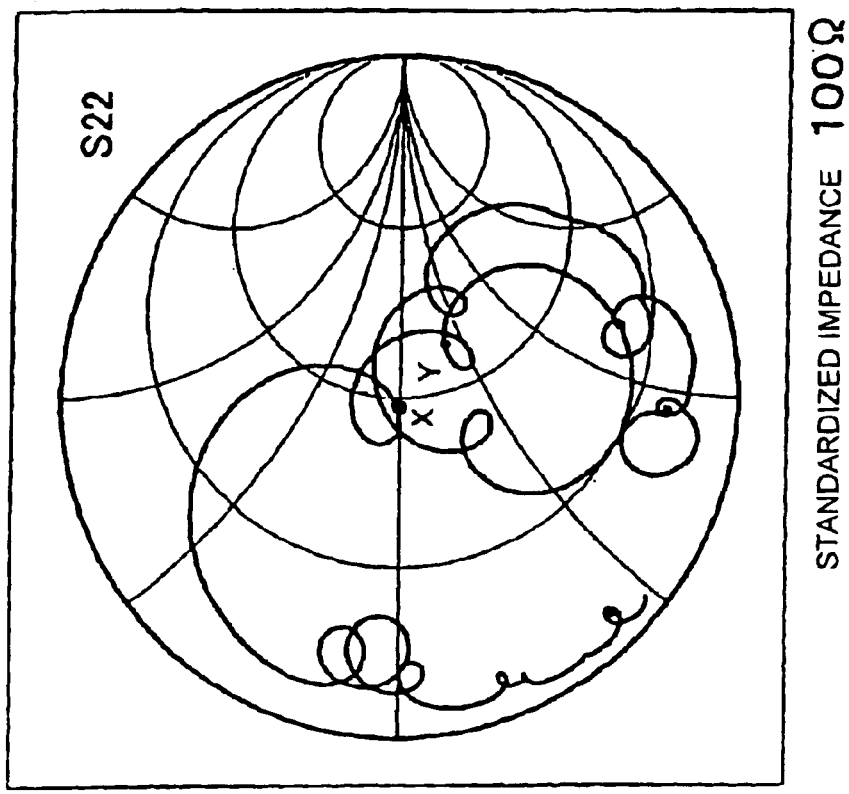
FIG. 9B is the same graph as that of FIG. 9A except that the standardized impedance is 150 Ω.
Figure 9A:
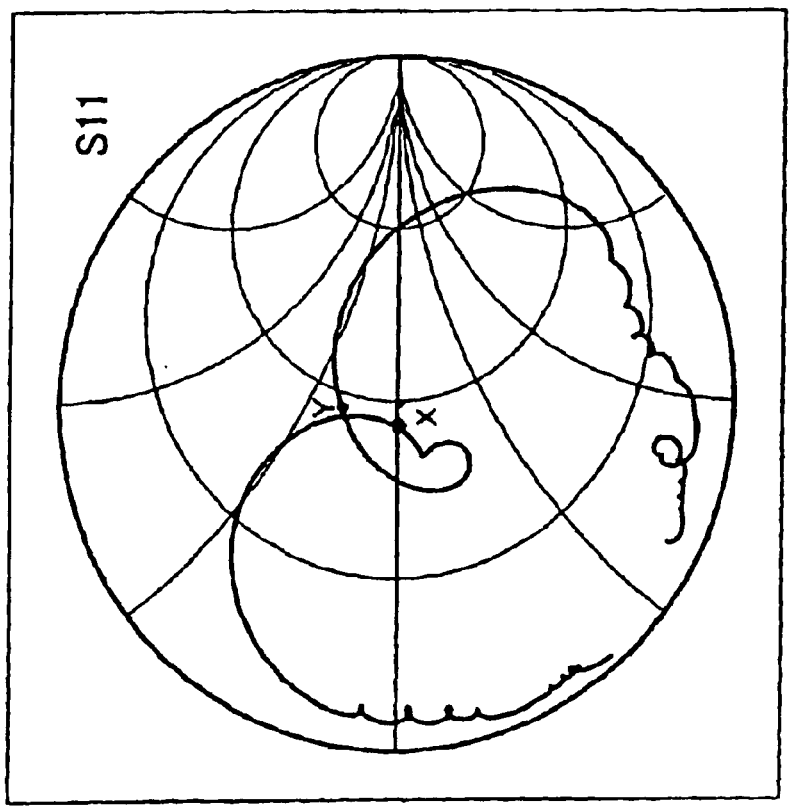
FIG. 9A is a graph showing the typical impedance characteristic in the first preferred embodiment for the standardized impedance of 50 Ω.
Figure 10:
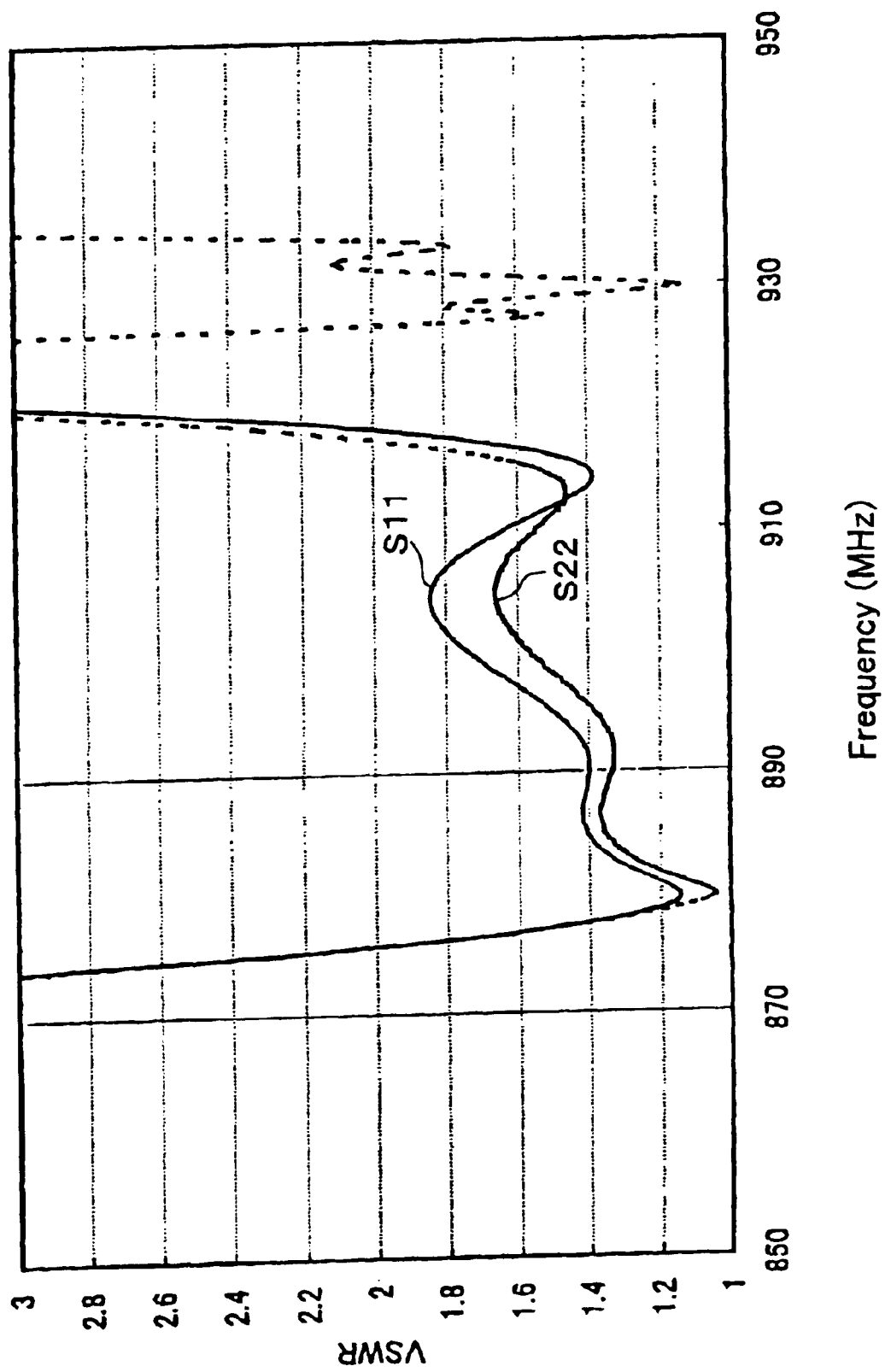
FIG. 10 is a graph showing the typical reflection (VSWR) characteristic in the first preferred embodiment of the present invention.

A surface acoustic wave device according to the first preferred embodiment of the present invention is preferably designed using parameters within the above-described optimum region. FIG. 8 shows the frequency characteristic. FIGS. 9A and 9B show the impedance characteristics thereof. FIG. 10 shows the reflection characteristic (VSWR) thereof. In this case, the standardized impedances on the unbalanced and balanced signal terminal sides are about 50 $\Omega$ and about 100 $\Omega$, respectively, that is, the impedance ratio is about 1:2.

The details of the respective surface acoustic wave elements 301 and 302 included in the surface acoustic wave device having the characteristics shown in FIGS. 8 to 10 are as follows, in which $\lambda$i is a wavelength depending on the pitch of the small pitch electrode fingers, $\lambda$I is a wavelength depending on the pitch of the other electrode fingers, and $\lambda$R is a wavelength in a reflector.

meshing width: 228 $\mu$m (51 $\lambda$I)
the number of IDTs (in the order of 304, 303, and 305): 29(4)/(3) 35(3)/(4) 29 (the figures in the parentheses represent the number of the small pitch electrode fingers; and the numbers are the same for the IDTs 309, 308, and 310)
the number N1 of electrode fingers connected on the balanced signal terminal side: 132
the number N2 of electrode fingers connected on the unbalanced signal terminal side: 82 (N2/N1=62.1%)
the number in a reflector: 90
(reflector frequency f ref))/(IDT frequency f idt): 0.998
IDT-reflector gap: 0.50 $\lambda$R
Here gap is defined as the distance between the centers of adjacent electrode fingers.

The point X at f=880 MHz and the point T at f=915 MHz are plotted on the impedance characteristic curves in FIGS. 9A and 9B, respectively. The impedance in the pass band is in the range of about 43 Ω to about 46 Ω for S11, which is less than 50 Ω. Thus, the matching is achieved for the standardized impedance. For S22, the impedance in the range of the point X to Y is slightly higher for the matching point. However, the matching is substantially achieved for the standardized impedance. Therefore, the ratio of the impedance on the unbalanced signal terminal side to that on the balanced signal terminal side is approximately 1:2.

Figure 37:
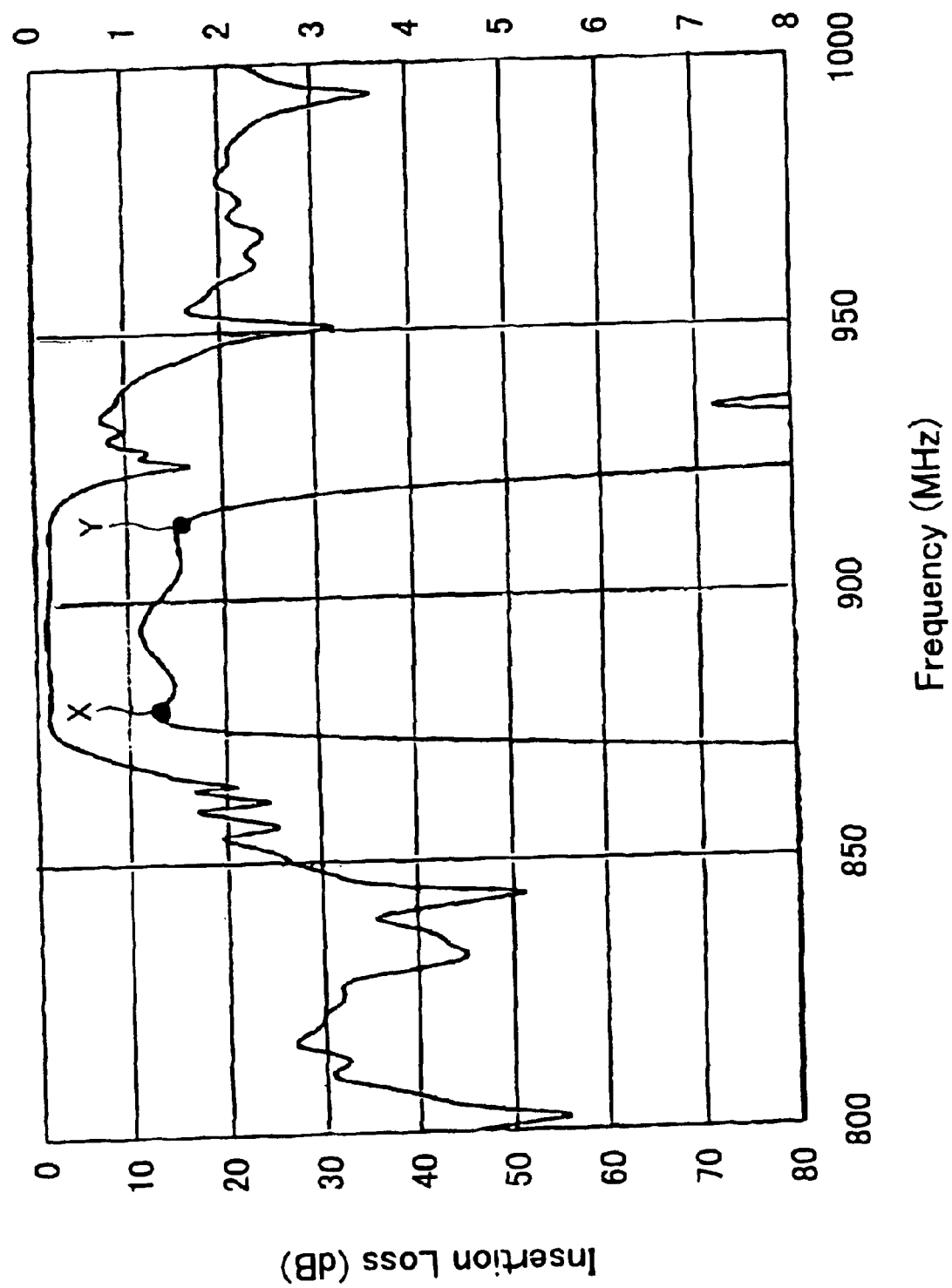
FIG. 37 is a graph showing the frequency characteristic of a surface acoustic wave device according to the first preferred embodiment, in which the ratio of the impedances on the unbalanced and balanced signal terminal sides is approximately 1:3.
Figure 38B:
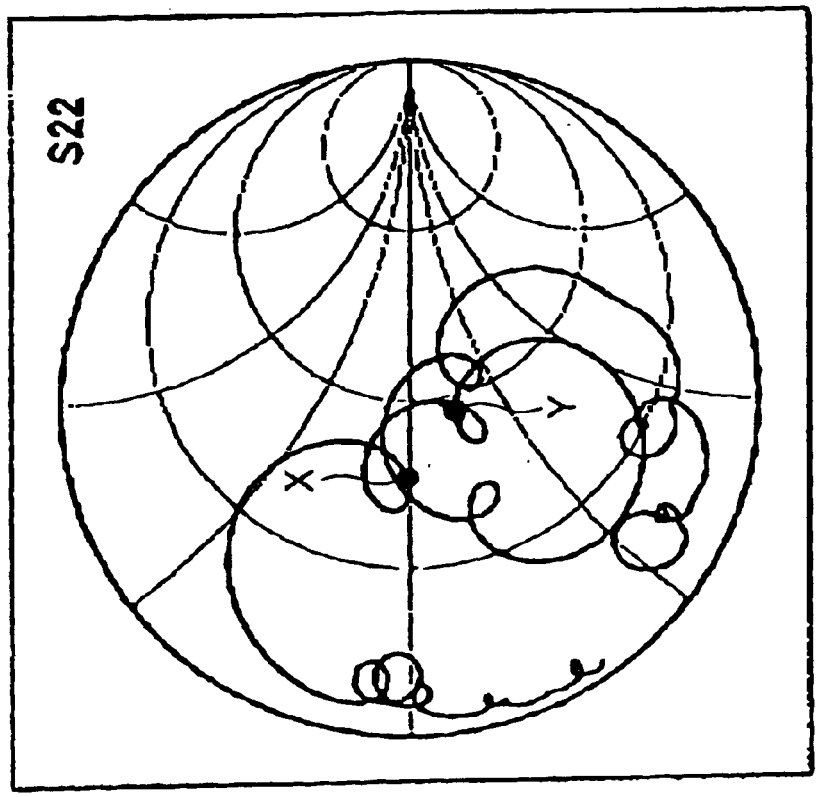
FIG. 38B is the same graph as that of FIG. 38A except that the standardized impedance is 150 Ω.
Figure 38A:
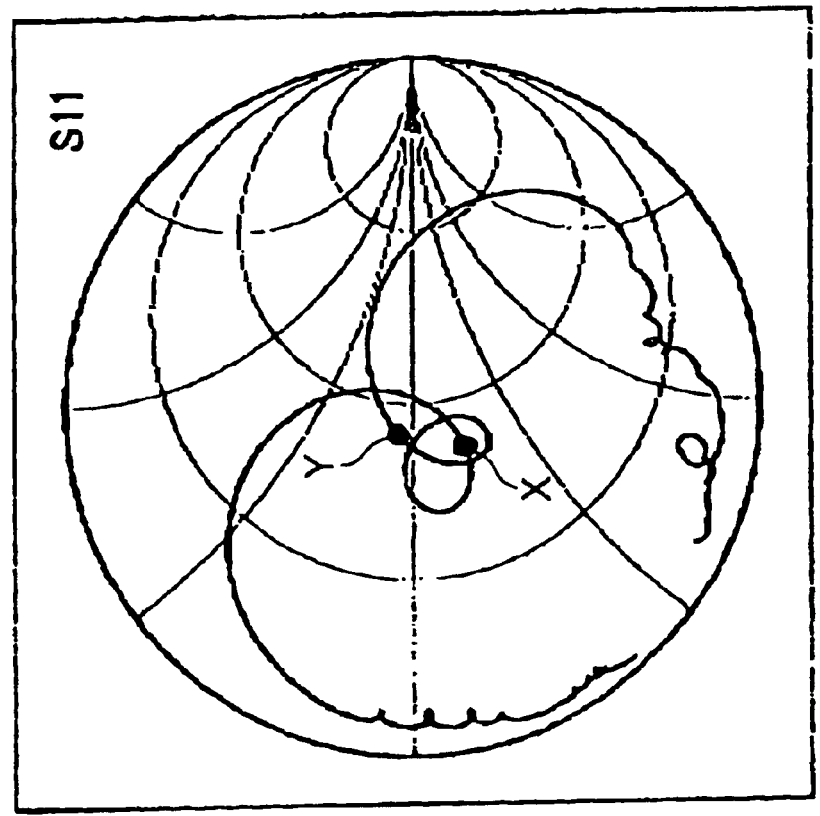
FIG. 38A is a graph showing the impedance characteristic of a surface acoustic wave device according to the first preferred embodiment, in which the ratio of the impedances on the unbalanced and balanced signal terminal sides is approximately 1:3, obtained when the standardized impedance is 50 Ω.
Figure 39:
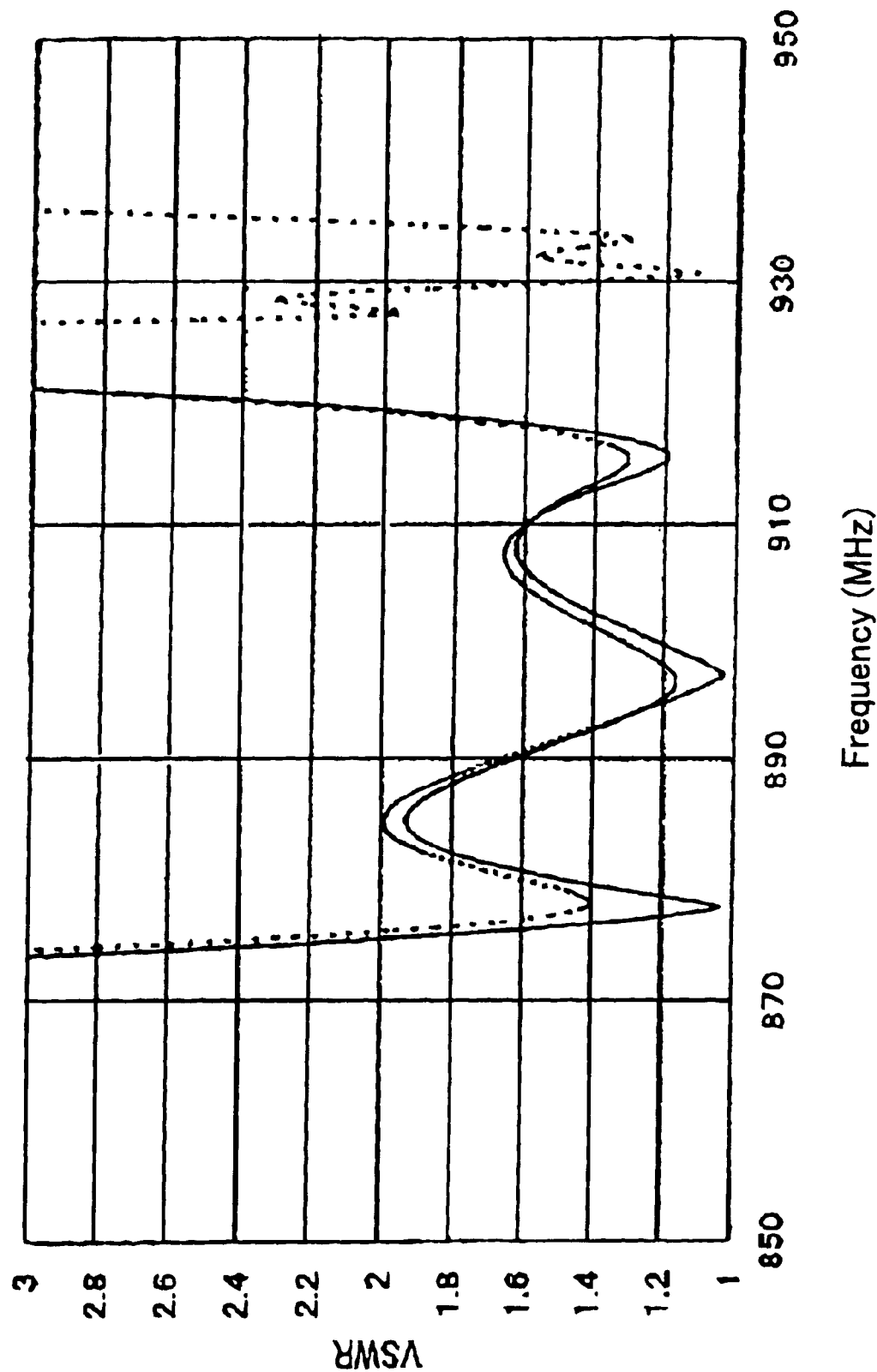
FIG. 39 is a graph showing the reflection characteristic (VSWR) of a surface acoustic wave device according to the first preferred embodiment, in which the ratio of the impedances on the unbalanced and balanced signal terminal sides is approximately 1:3.

Moreover, a surface acoustic wave device is designed so as to have the configuration of FIG. 1, and have the characteristics shown in FIGS. 8 to 10, in which the standardized impedances on the unbalanced and balanced signal terminal sides are set at about 50 Ω and about 150 Ω, respectively, that is, the impedance ratio is set at approximately 1:3. FIG. 37 shows the frequency characteristic of the device. FIGS. 38A and 38B show the impedance characteristics. FIG. 39 shows the reflection characteristic (VSWR).

Referring to the impedance for S22, the impedance in the region of the point X to Y is shifted to be lower with respect to the matching point. The VSWR is in the range of about 2.0 or less. Thus, the matching with respect to the standardized impedance is substantially achieved. Thereby, a surface acoustic wave device in which the ratio of the impedances on the unbalanced and balanced signal terminal sides is approximately 1:3 is provided using the parameters within the above-described optimum range.

The details of the surface acoustic wave elements 301 and 302 are as follows, in which $\lambda i$ is a wavelength depending on the pitch of the small pitch electrode fingers, $\lambda I$ is a wavelength depending on the pitch of the other electrode fingers, and $\lambda R$ is a wavelength in a reflector.

meshing width: 228 μm (51 λ1)

the number of IDTs (in the order of 304, 303, and 305): 29(4)/(3) 35(3)/(4) 29 (the figures in the parentheses represent the numbers of the small pitch electrode fingers; and the numbers are the same for the IDTs 309, 308, and 310)

the number N1 of the electrode fingers connected on the balanced signal terminals: 132 the number N2 of the electrode fingers connected on the unbalanced signal terminal side: 82 (N2/N1=62.1%)

the number in a reflector: 90

(reflector frequency f ref))/(IDT frequency f idt): 0.998

IDT-reflector gap: 0.50 λR

Referring to the configuration of FIG. 1, to achieve such a characteristic that the ratio of the impedances on the unbalanced and balanced signal terminal sides is about 1:2 or about 1:3, IDT(s) with the number of (n-1)/2 in one of the first and second surface acoustic wave elements (n represents the number of IDTs in each of the first and second surface acoustic wave elements) is electrically connected in parallel to IDT(s) with the number of (n-1)/2 in the other to define an unbalanced signal terminal. The IDTs with the number of {[n-1)/2]+1} in each of the first and second surface acoustic wave elements are connected in series with each other to define a balanced signal terminal. According to this configuration, the logarithmic relationship between the input-output IDTs is maintained to be approximately the same as that obtained by an ordinary design. Thus, this configuration is preferable.

Figure 11:
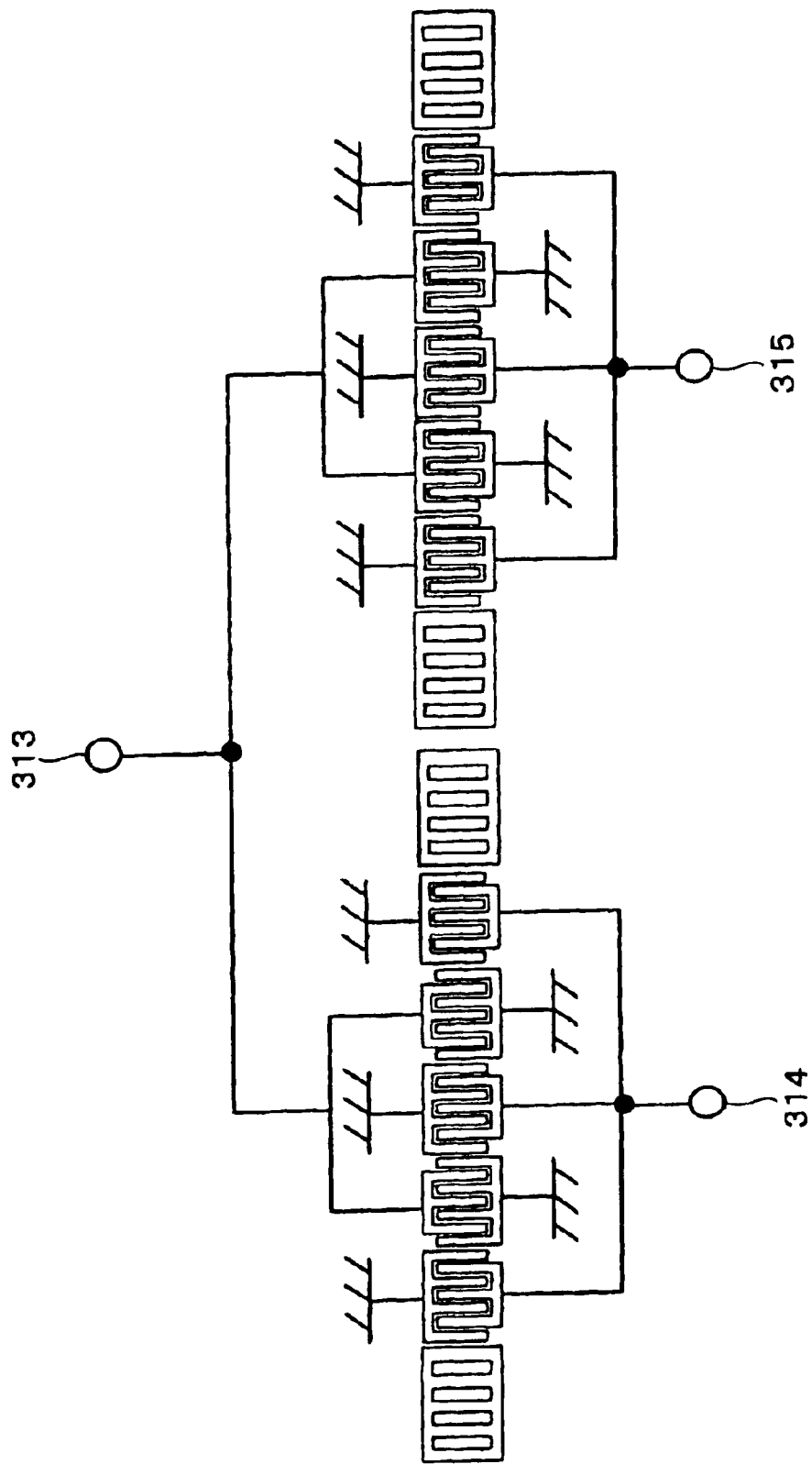
FIG. 11 schematically shows the configuration of another modification of the surface acoustic wave device according to the first preferred embodiment of the present invention.

In the description above, the longitudinally coupled resonator type surface acoustic wave element including three IDTs is discussed by way of an example. A longitudinally coupled resonator type surface acoustic wave element including five IDTs may be used as shown in FIG. 11. Moreover, according to the first preferred embodiment, two surface acoustic wave elements are provided. Similarly, a surface acoustic wave device including one surface acoustic wave element and having a balanced-unbalanced transforming function shown in FIG. 23 or FIG. 24 may be provided.

As described above, according to the first preferred embodiment, a surface acoustic wave device having a balanced-unbalanced transforming function, in which the ratio of the impedances on the unbalanced and balanced terminal sides is about 1:2 or about 1:3, is provided by setting the ratio N1/N2 (N1 represents the total number of the electrode fingers of IDTs connected on the balanced signal terminal side, and N2 represents the total number of the electrode fingers of IDTs connected on the balanced signal terminal side) in the range of about 50% to about 70%, and the meshing width (W) of the electrodes of the IDTs is in the range of about 43 λ to about 58 λ (λI represents the wavelength of a surface acoustic wave, more preferably by configuring on the condition that the IDT-reflector gap is in the range of about 0.46 λr to about 0.54 λr, or the frequency ratio f ref/f idt is in the range of about 0.993 to about 1.003.

Hereinafter, a surface acoustic wave device according to a second preferred embodiment of the present invention will be described. In the second preferred embodiment, the same members having the same functions as those described in the first preferred embodiment are designated by the same reference numbers, and their description is omitted.

Figure 12:
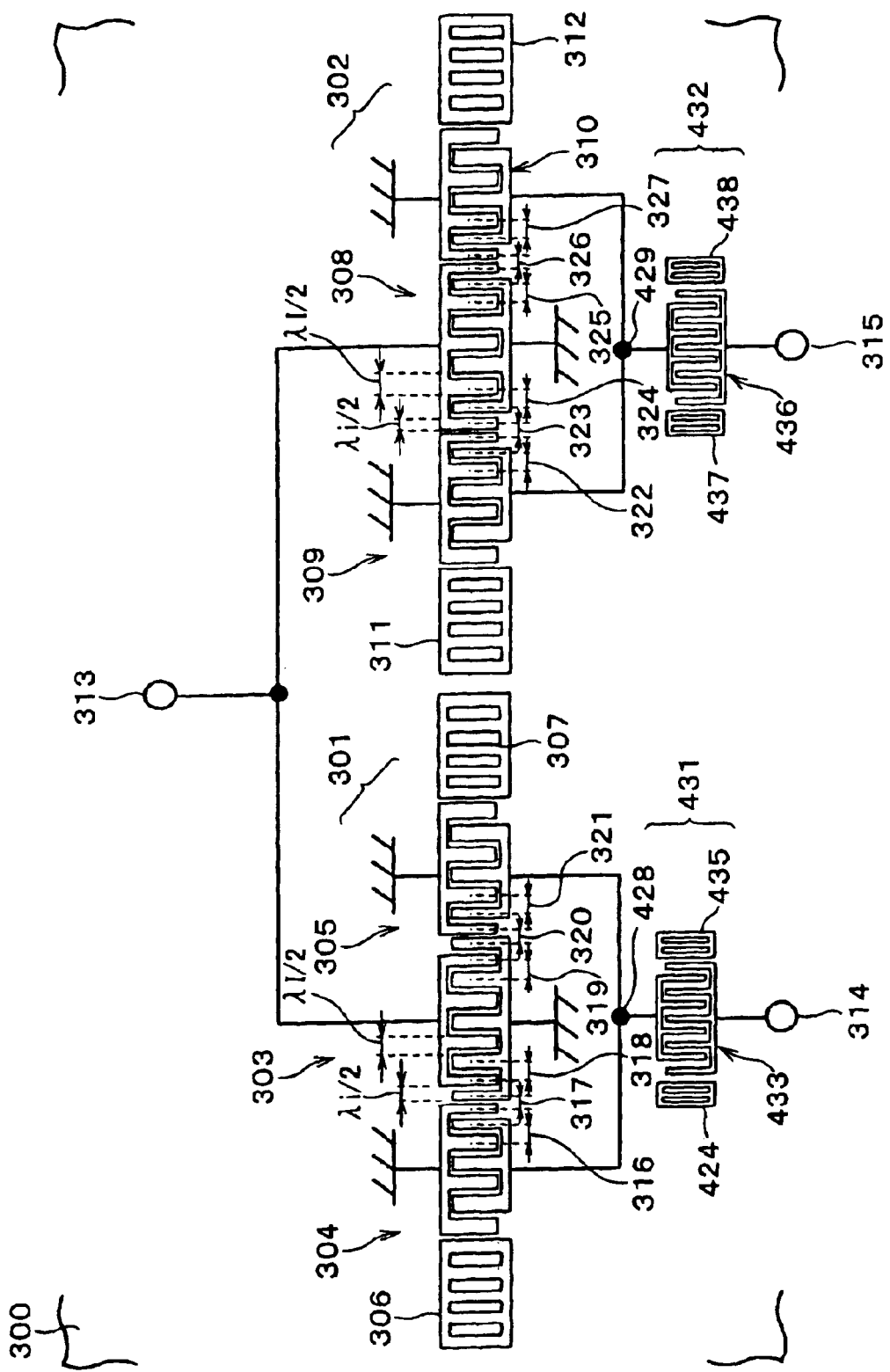
FIG. 12 schematically shows the configuration of a surface acoustic wave device according to a second preferred embodiment of the present invention.

According to the second preferred embodiment, a surface acoustic wave resonator 432 is connected in series at a point 428 where the IDTs 304 and 305 of the surface acoustic wave element 301 are connected in parallel as shown in FIG. 12.

Similarly, a surface acoustic wave resonator 432 is connected in series at a point 429 in the surface acoustic wave element 302. The surface acoustic wave resonator 431(432) includes IDT 433(536) arranged in the propagation direction of the surface acoustic wave and reflectors 434(437) and 435(438) arranged so as to sandwich the IDT 433(436).

The details of the surface acoustic wave reflectors 431 and 432 are as follows, in which λti is a wavelength depending on the pitch in the IDT of the surface acoustic wave resonator, and λtr is a wavelength depending on the pitch in a reflector.

meshing width: 100 μm the number in IDT: 161 the number in a reflector: 10

IDT-reflector gap: 0.50 λtr

IDT duty: 0.70 reflector duty: 0.70

(IDT frequency f ti)/(reflector frequency f tr)=1.0

Figure 13:
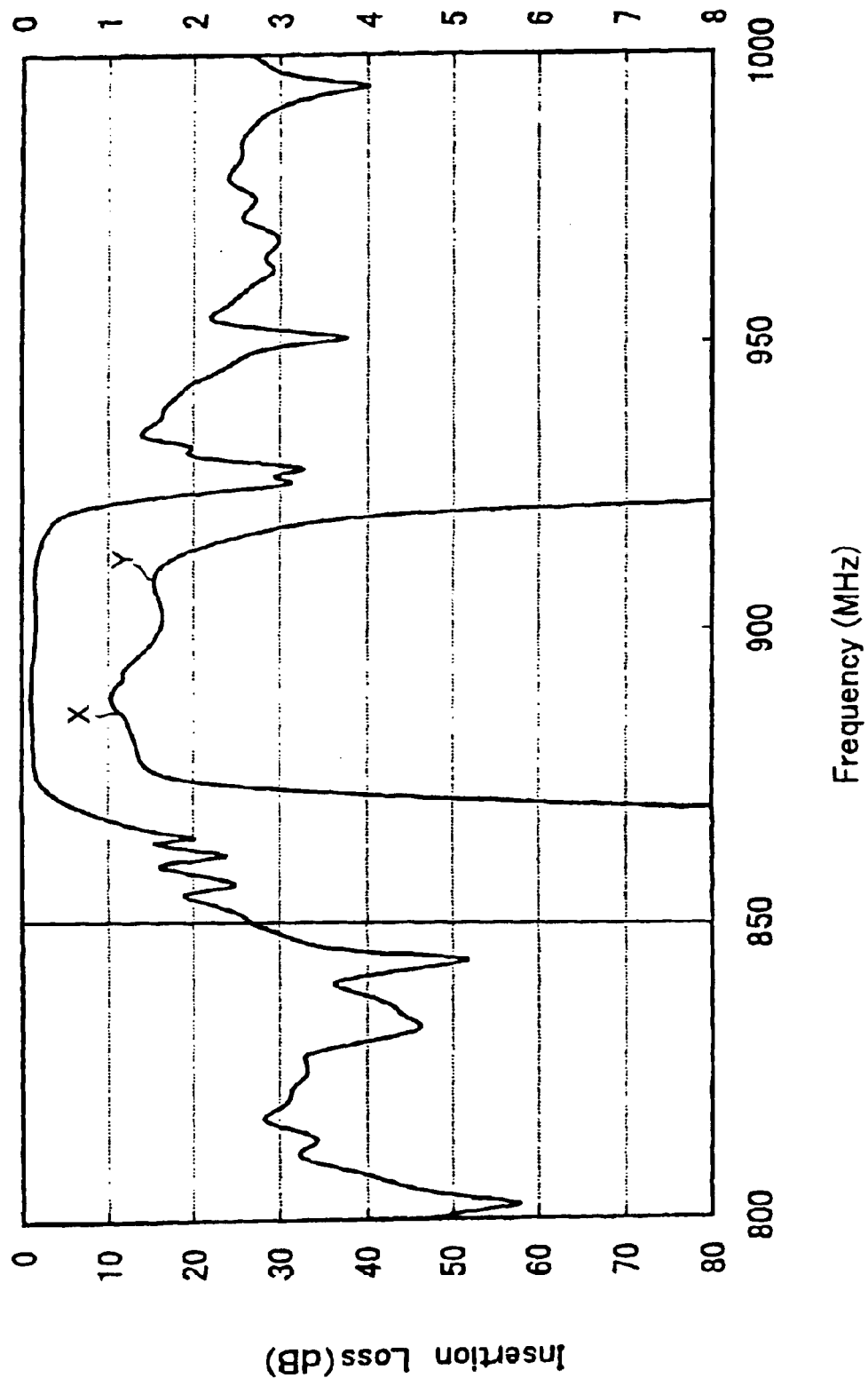
FIG. 13 is a graph showing the typical frequency characteristic in the second preferred embodiment of the present invention.
Figure 14B:
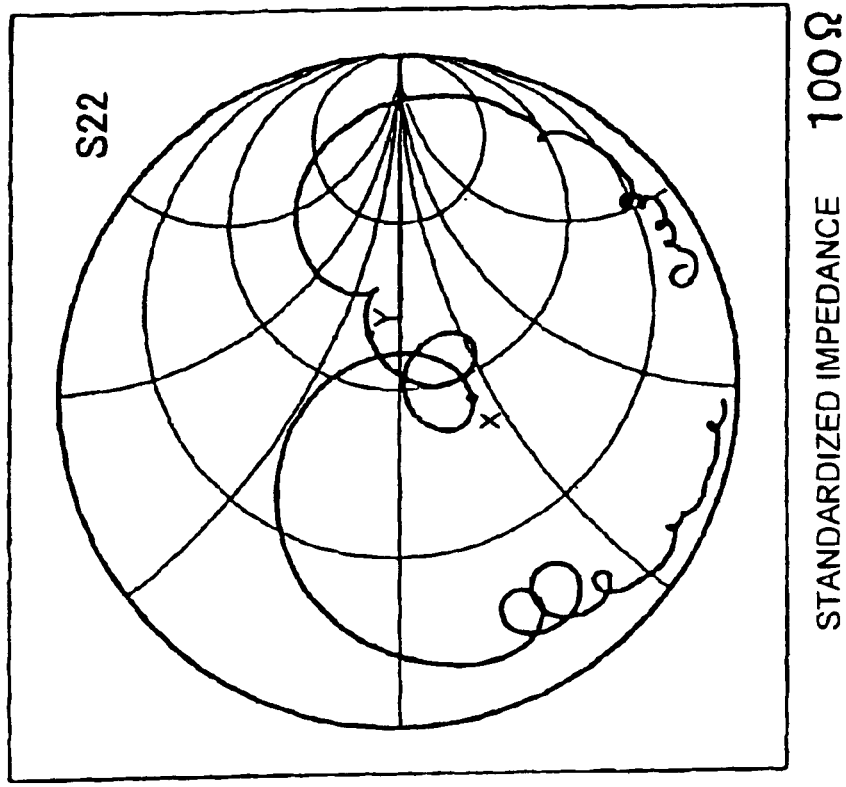
FIG. 14B is the same graph as that of FIG. 14A except that the standardized impedance is 100 Ω.
Figure 14A:
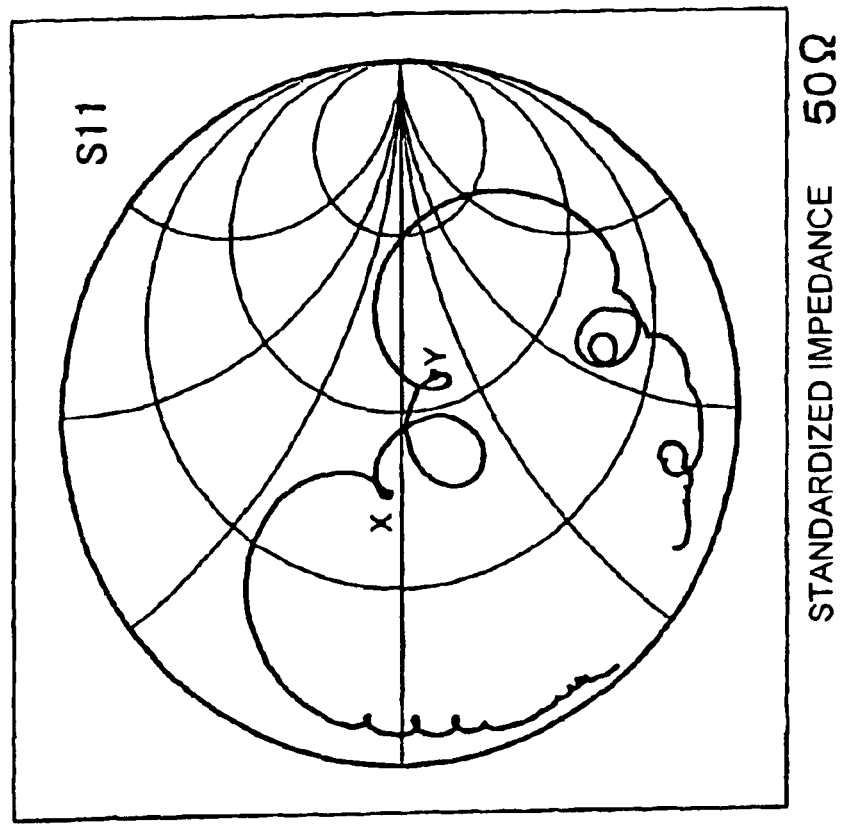
FIG. 14A is a graph showing the typical impedance characteristic in the second preferred embodiment for the standardized impedance of 50 Ω.
Figure 15:
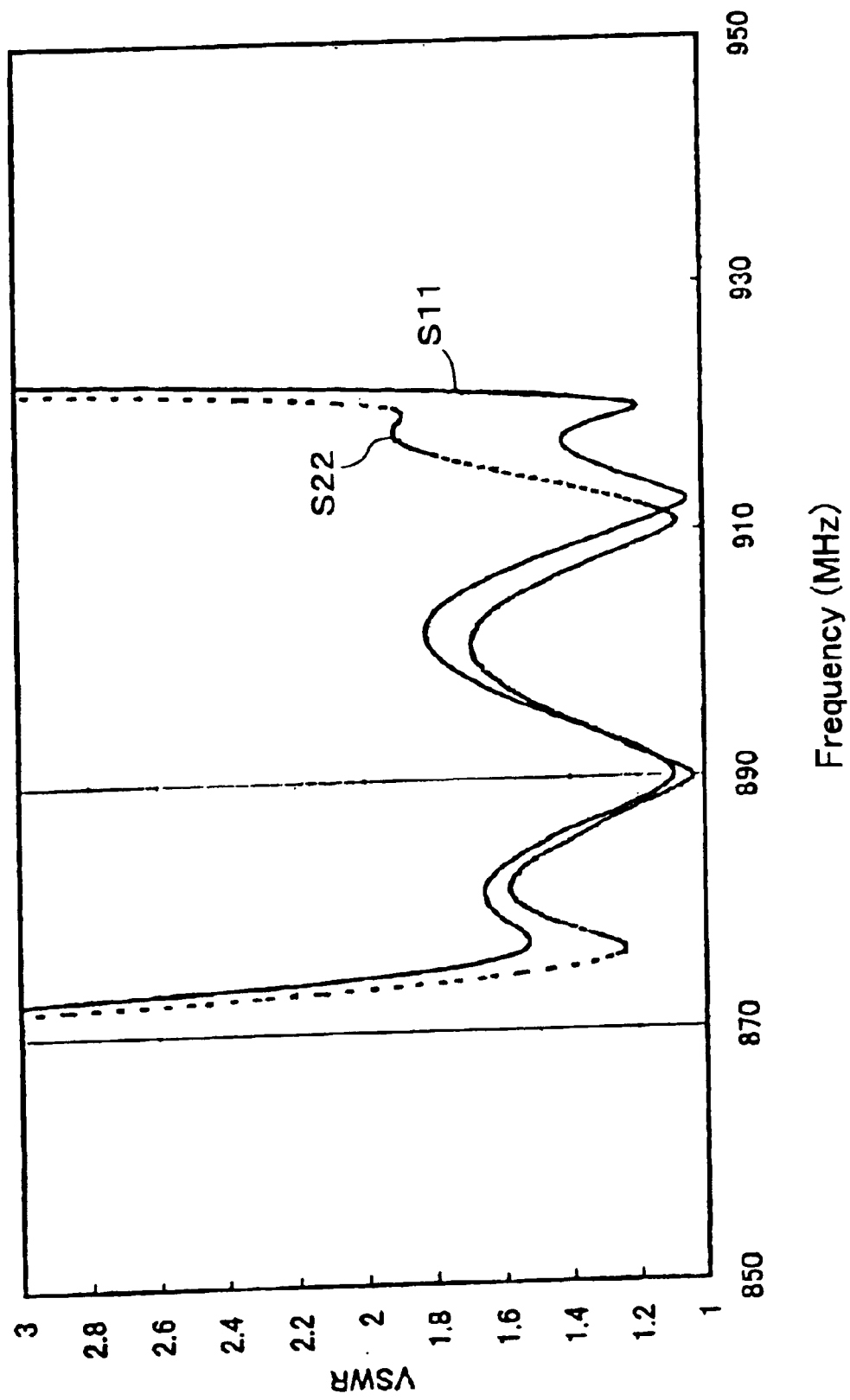
FIG. 15 is a graph showing the typical reflection (VSWR) characteristic in the second preferred embodiment of the present invention.

FIG. 13 shows the frequency characteristic of the surface acoustic wave device according to the second preferred embodiment. FIGS. 14A and 14B show the impedance characteristics. FIG. 15 shows the reflection characteristic (VSWR). In this case, the standardized impedance on the unbalanced terminal side is about 50 Ω, and the standardized impedance on the balanced signal terminal side is about 100 Ω, that is, the impedance ratio is about 1:2.

The point X at f=880 MHz and the point Y at f=915 MHz are plotted on the impedance characteristic curves. As seen in FIGS. 14A, 14B, and FIG. 15, the impedances in the pass band are substantially matched for S11 and S22 with respect to the standardized impedances. Thus, the ratio of the impedances on the unbalanced and balanced signal sides is approximately 1:2.

Figure 40:
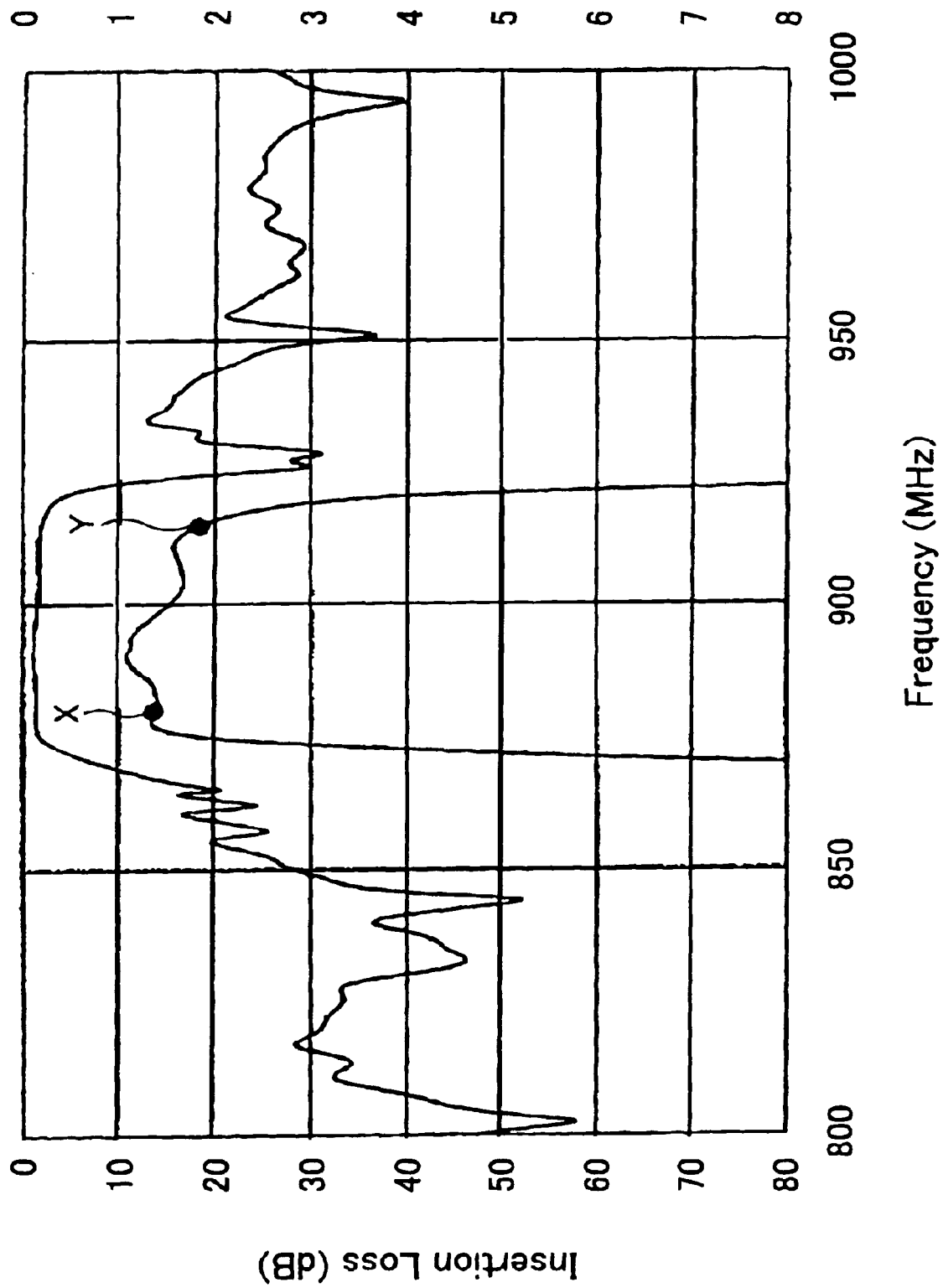
FIG. 40 is a graph showing the frequency characteristic of the surface acoustic wave device according to the second preferred embodiment, in which the ratio of the impedances on the unbalanced and balanced signal terminal sides is approximately 1:3.
Figure 41B:
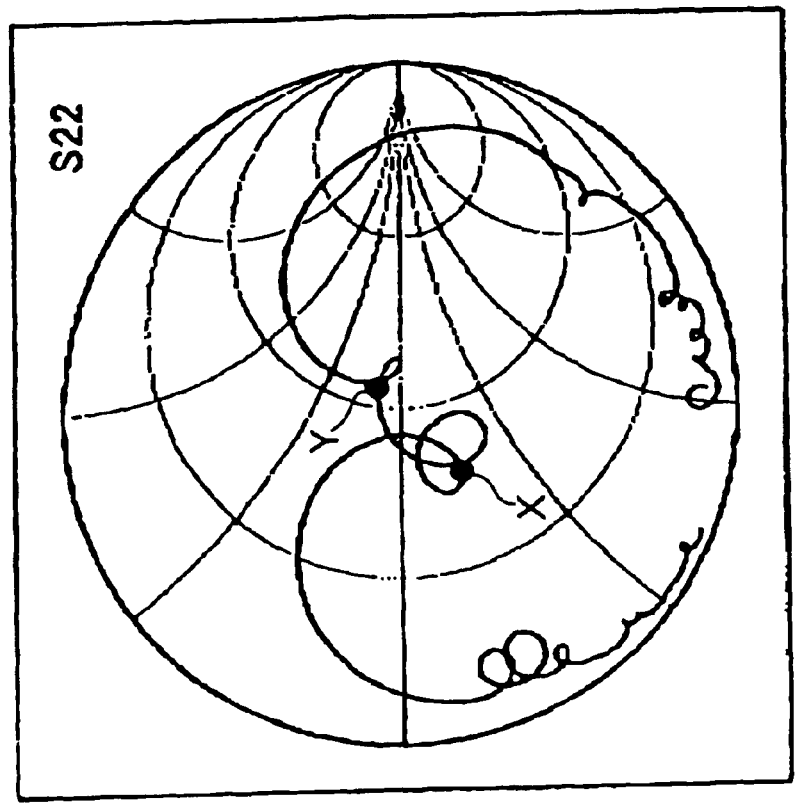
FIG. 41B is the same graph as that of FIG. 41A, except that the standardized impedance is 150 Ω.
Figure 41A:
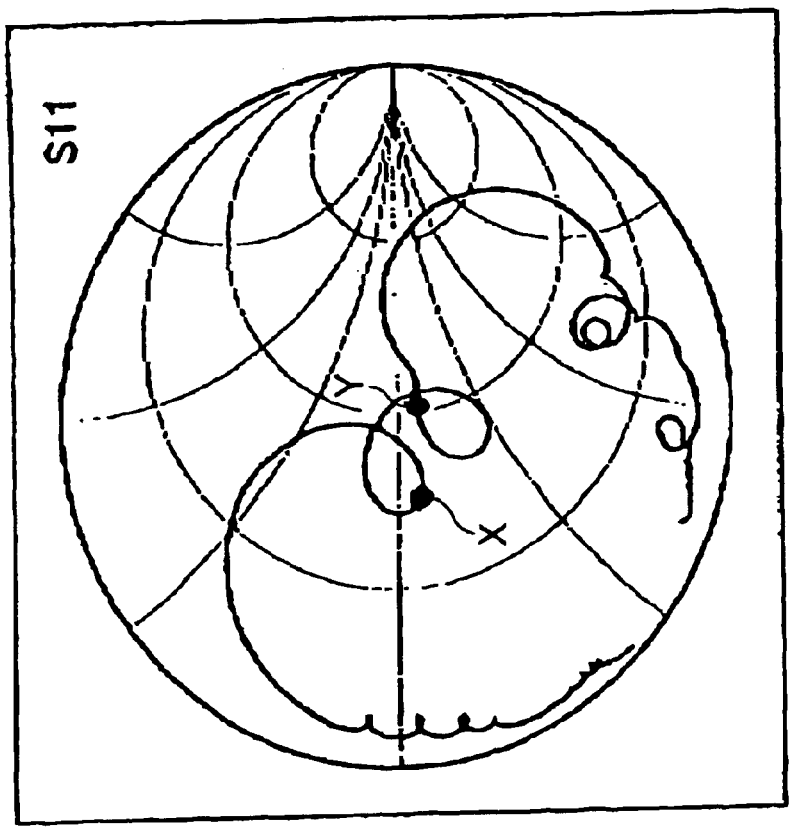
FIG. 41A is a graph showing the impedance characteristic of the surface acoustic wave device according to the second preferred embodiment, in which the ratio of the impedances on the unbalanced and balanced signal terminal sides is approximately 1:3, obtained when the standardized impedance is 50 Ω.
Figure 42:
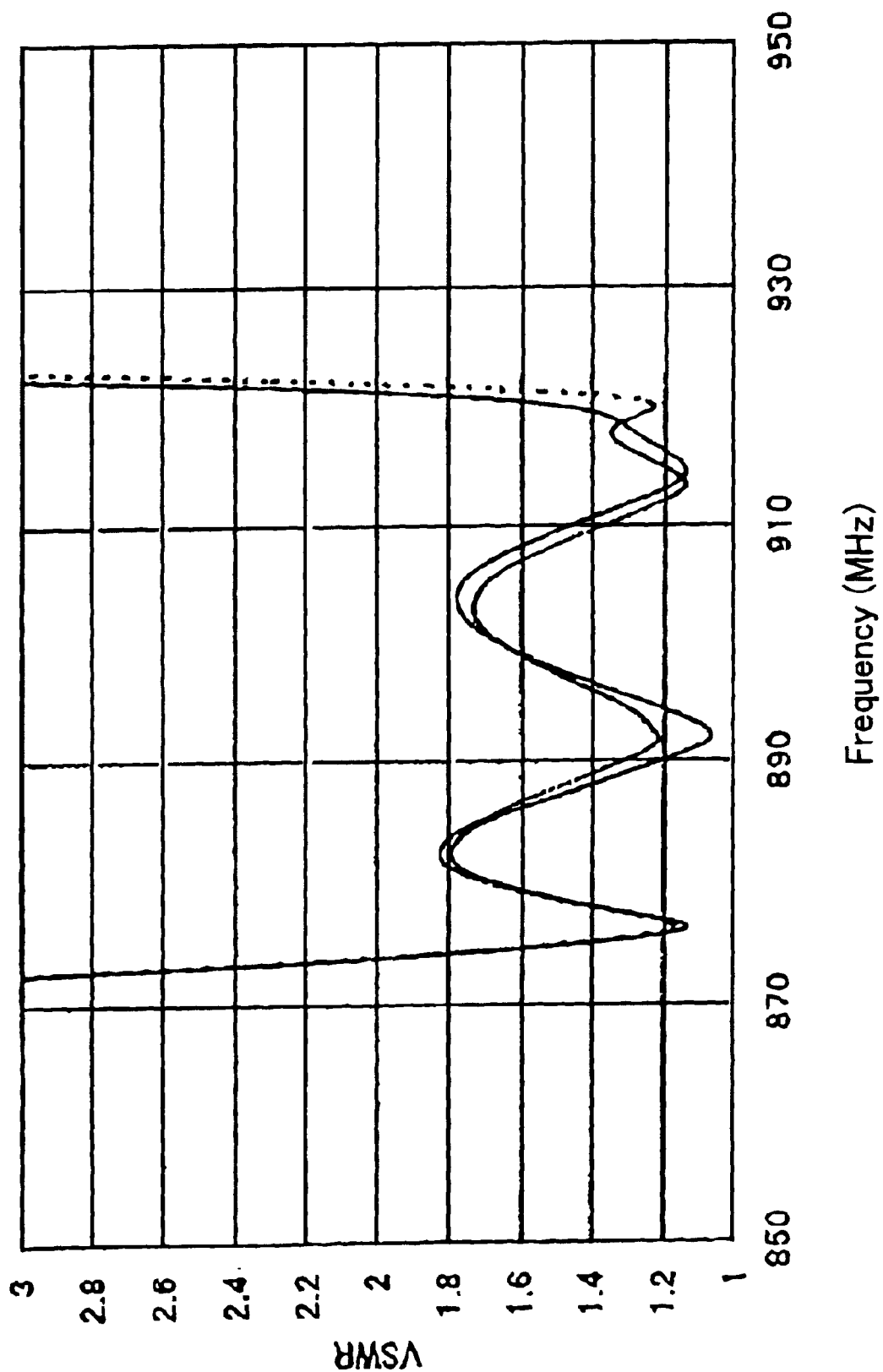
FIG. 42 is a graph showing the reflection characteristic (VSWR) of the surface acoustic wave device according to the second preferred embodiment, in which the ratio of the impedances on the unbalanced and balanced signal terminal sides is approximately 1:3.

Moreover, a surface acoustic wave device is designed so as to have the configuration of FIG. 12 and the characteristics shown in FIGS. 13 to 15, in which the standardized impedances on the unbalanced and balanced signal terminal sides are set at about 50 Ω and about 150 Ω, respectively, that is, the impedance ratio is set at about 1:3. FIG. 40 shows the frequency characteristic of the device. FIGS. 41A and 41B show the impedance characteristics. FIG. 42 shows the reflection characteristic (VSWR).

As seen in FIGS. 40 to 42, when the standardized impedance on the balanced signal terminal side is about 150 Ω, the matching is sufficiently achieved for S11 and S22. Accordingly, the ratio of the impedances on the unbalanced and balanced signal terminal sides is set at about 1:3 in the second preferred embodiment.

The details of the surface acoustic wave reflectors 431 and 432 are as follows, in which λti is a wavelength depending on the pitch in the IDT of the surface acoustic wave resonator, and λtr is a wavelength depending on the pitch in a reflector.

meshing width: 100 μm the number in IDT: 161 the number in a reflector: 10

IDT-reflector gap: 0.50 λtr

IDT duty: 0.70 reflector duty: 0.70

(IDT frequency f ti)/(reflector frequency f tr)=1.0

Figure 16:
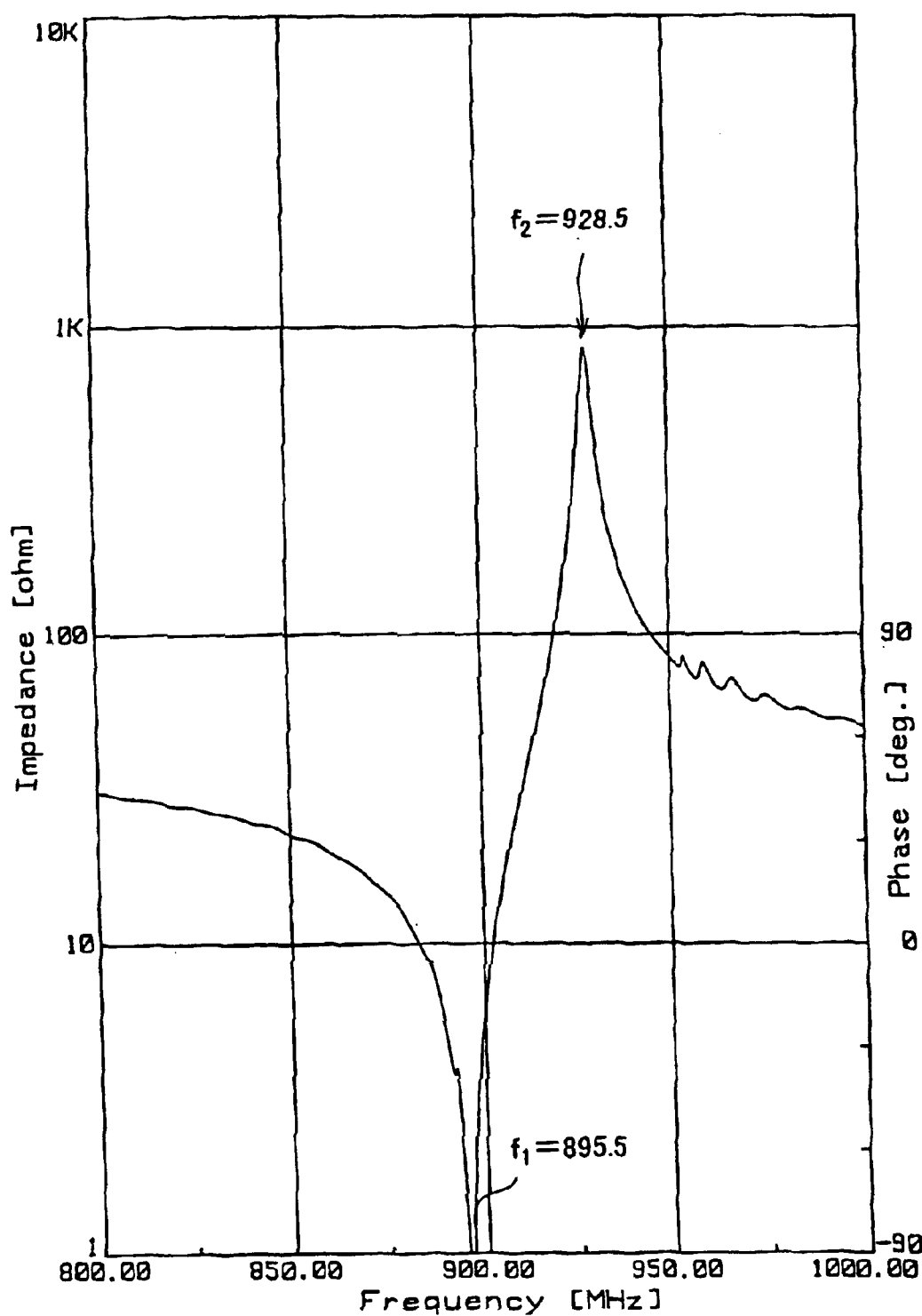
FIG. 16 is a graph showing the frequency-impedance characteristic of a surface acoustic wave resonator used in the surface acoustic wave device of the second preferred embodiment of the present invention.

Hereinafter, the reason that the effects of the second preferred embodiment are achieved will be described. FIG. 16 shows the frequency-impedance characteristics of the surface acoustic wave resonators 431 and 432. In FIG. 16, f1 represents a resonance frequency at which the impedance is minimum, and f2 represents an anti-resonance frequency at which the impedance is maximum. For the surface acoustic wave resonators 431 and 432, f1 is 895.5 MHz, and f2 is 928.5 MHz. When the surface acoustic wave resonator is added in series, the impedance on the side to which where the resonator is added is inductive in the range of the resonance frequency f1 to the anti-resonance frequency f2, and is capacitive in the other frequency range.

Figure 17:
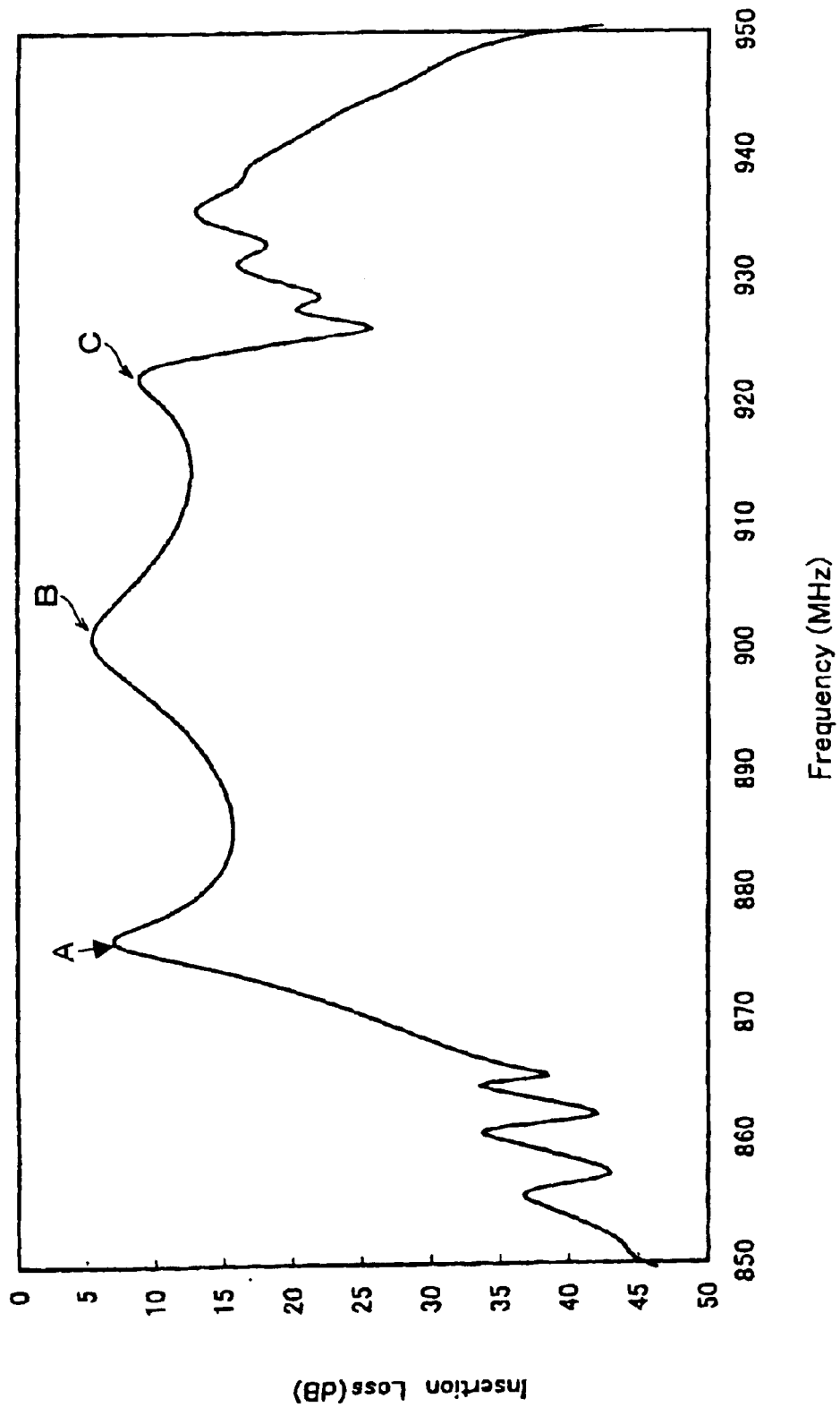
FIG. 17 is a graph showing the respective resonance modes of the surface acoustic wave resonator used in the surface acoustic wave device of the second preferred embodiment of the present invention.
Figure 18A:
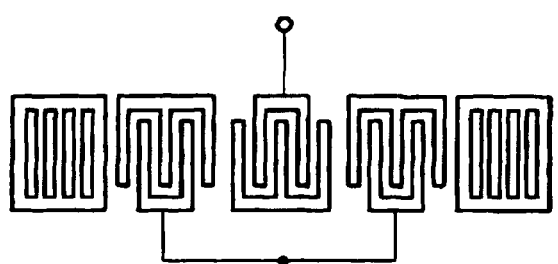
FIG. 18A schematically shows the configuration of an IDT.
Figure 18B:
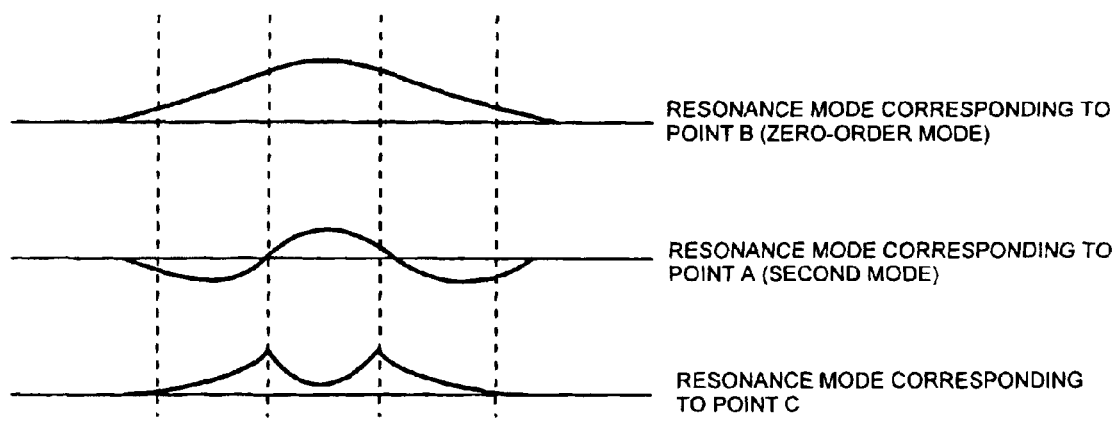
FIG. 18B is a graph showing the respective resonance modes in correspondence to the arrangement of the IDT for illustration of the effective current distributions of the respective resonance modes.

In the longitudinally coupled resonator type surface acoustic wave element which is a 3 IDT type in this preferred embodiment, three resonance modes are used to form a pass band as shown in FIGS. 17 and 18. FIG. 17 shows the frequency characteristic of one of the surface acoustic wave elements 301 and 402 in the configuration of the second preferred embodiment. The frequency characteristic is measured while the impedance is intentionally excluded to facilitate understanding of the resonance modes of the characteristic. FIG. 18 shows the strength distribution of effective current.

The response at the lowest frequency corresponding to the point A is called "second mode". This resonance mode has two nodes in the effective current distribution. The response at the center in the band corresponding to the point B is called "zero-order mode", which has no node in the effective current distribution. The response at the highest frequency corresponding to the point C is a standing wave resonance mode (hereinafter, referred to as high-band side mode) in which the IDT-IDT gap provides a peak in the strength distribution of a surface acoustic wave.

In the second preferred embodiment, the second mode frequency is 876 MHz, the zero-order mode frequency is 901 MHz, and the high-band side frequency is 922.5 MHz. Accordingly, the zero-order mode frequency and the high-band side mode frequency of each of the surface acoustic wave elements 401 and 402 are located between the resonance frequency f1 and the anti-resonance frequency f2 of one of the surface acoustic wave elements 431 and 432.

Figure 19B:
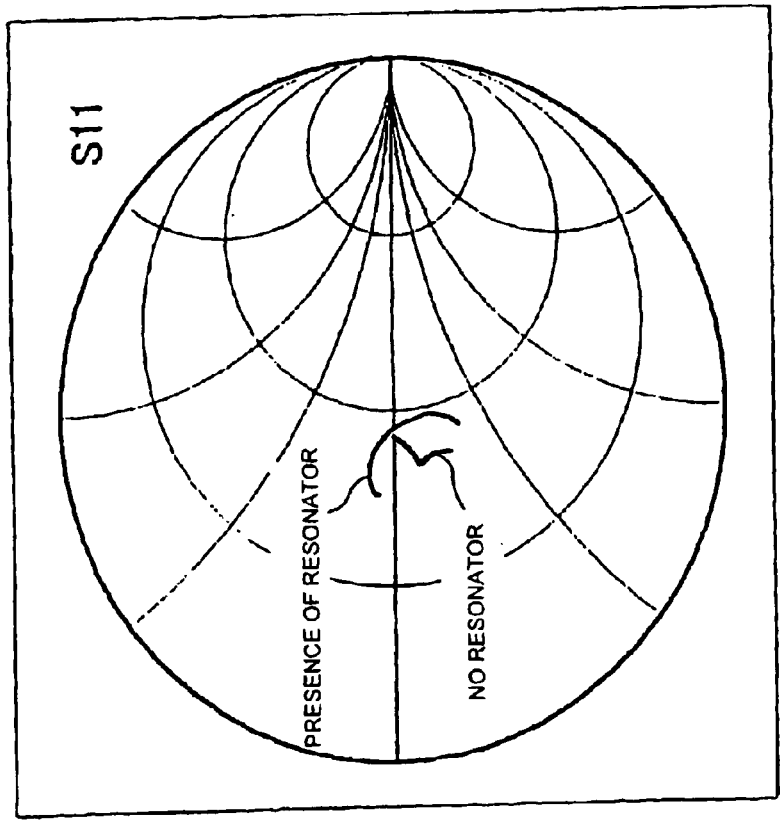
FIG. 19B is the same graph as that of FIG. 19A except that the standardized impedance is 100 Ω.
Figure 19A:
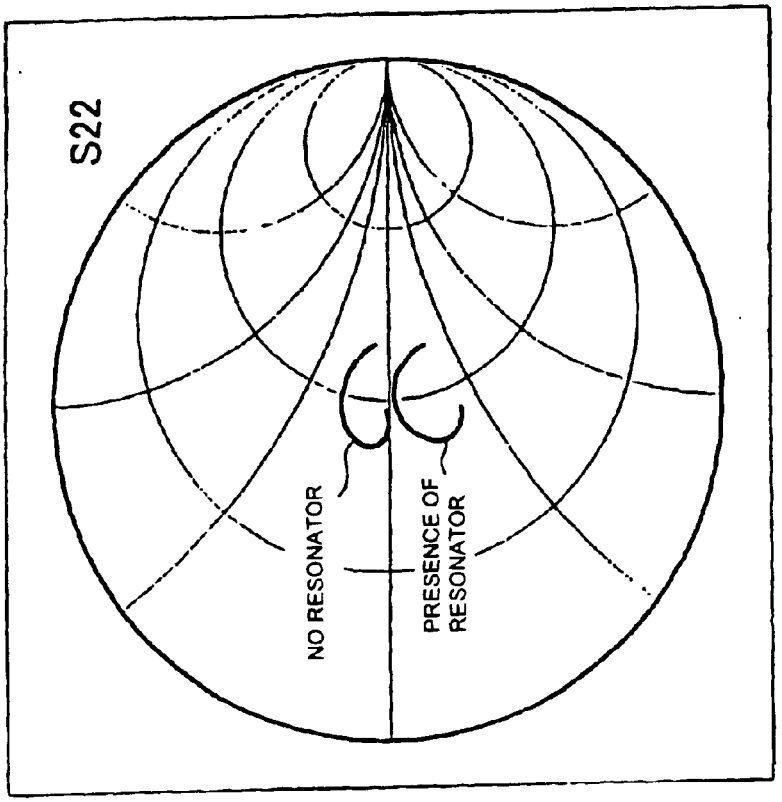
FIG. 19A is a graph showing the impedance characteristics (880 MHz to 895.5 MHz, low-band side) in the second preferred embodiment (presence of resonator) and in the second preferred embodiment from which the resonators are excluded (no resonator), obtained when the standardized impedance is 50 Ω.
Figure 20B:
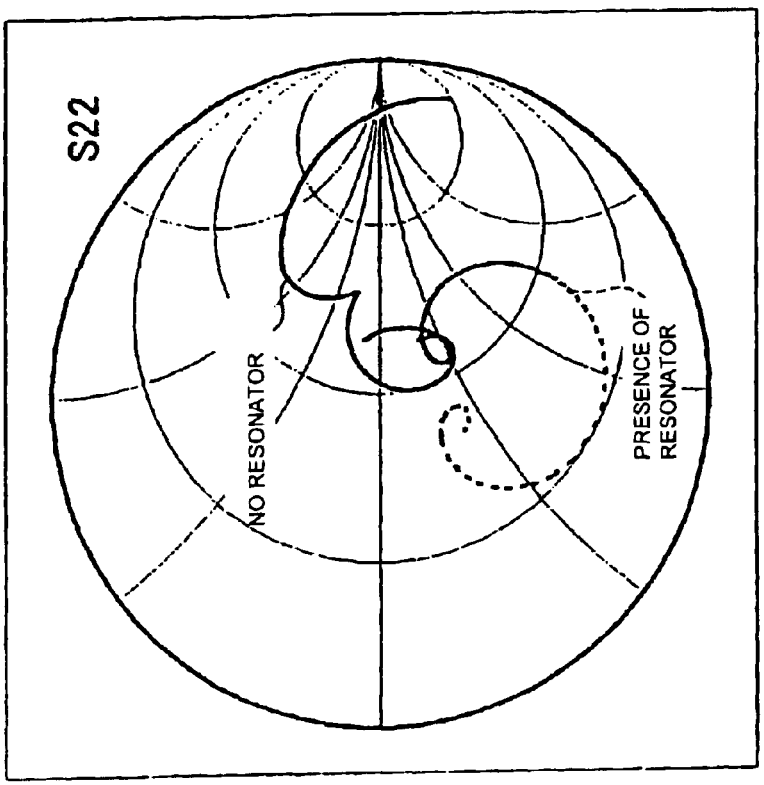
FIG. 20B is the same graph as that of FIG. 19A except that the standardized impedance is 100 Ω.
Figure 20A:
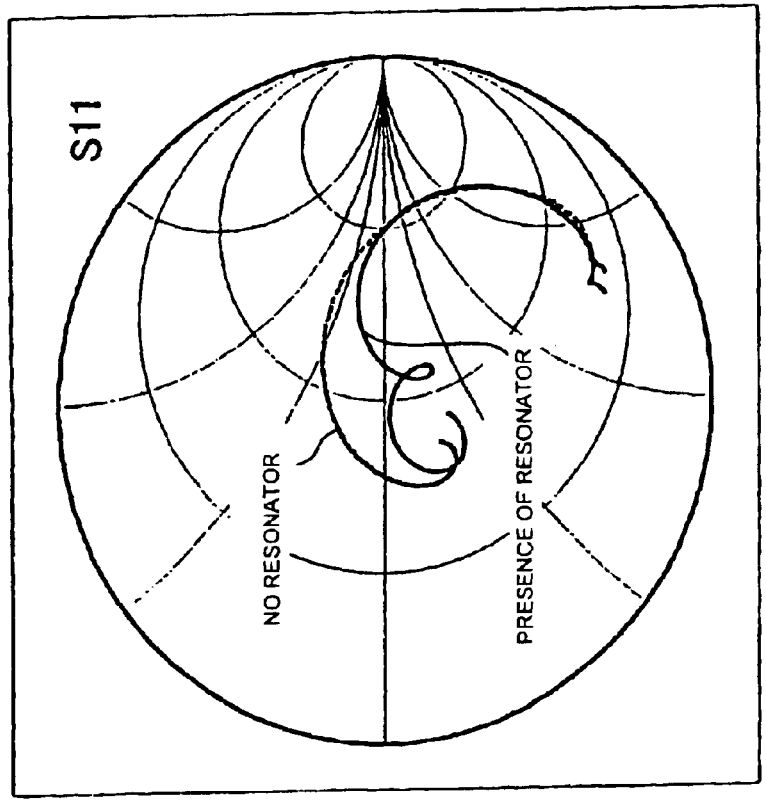
FIG. 20A is a graph showing the impedance characteristics (895.5 MHz to 928.5 MHz, high-band side) in the second preferred embodiment (presence of resonator) and in the second preferred embodiment from which the resonators are excluded (no resonator), obtained when the standardized impedance is 50 Ω.

According to the configuration of the second preferred embodiment, surface acoustic wave resonators 431 and 432 are added to the surface acoustic wave elements 401 and 402. In this case, the change of the impedance will be described for the respective frequency ranges. FIGS. 19A and 19B show the change of the impedance characteristics in the range of 880 MHz to 895.5 MHz resonance frequency f1). FIGS. 20A and 20B show the change of the impedances in the range of 895.5 MHz (resonance frequency f1) to 928.5 MHz (anti-resonance frequency f2).

Referring to FIGS. 19 and 20, the surface acoustic wave resonator acts capacitively on the lower-side of the pass band, that is, in the range of 880 MHz to 895.5 MHz, such that the impedance of S22 is shifted to be capacitive. On the other hand, the surface acoustic wave resonator acts inductively on the higher-side of the pass band, that is, in the range of 895.5 MHz to 928.5 MHz, such that the impedance of S22 is shifted to be above the actual axis. That is, the matching state is greatly improved. In particular, the ratio of the impedances on the input-output sides is about 1:2 or about 1:3 by inserting the surface acoustic wave resonator which acts inductively, ranging from the zero-order mode frequency to the high-band side mode frequency. Moreover, a characteristic having a high attenuation out of the pass band is achieved.

Figure 21:
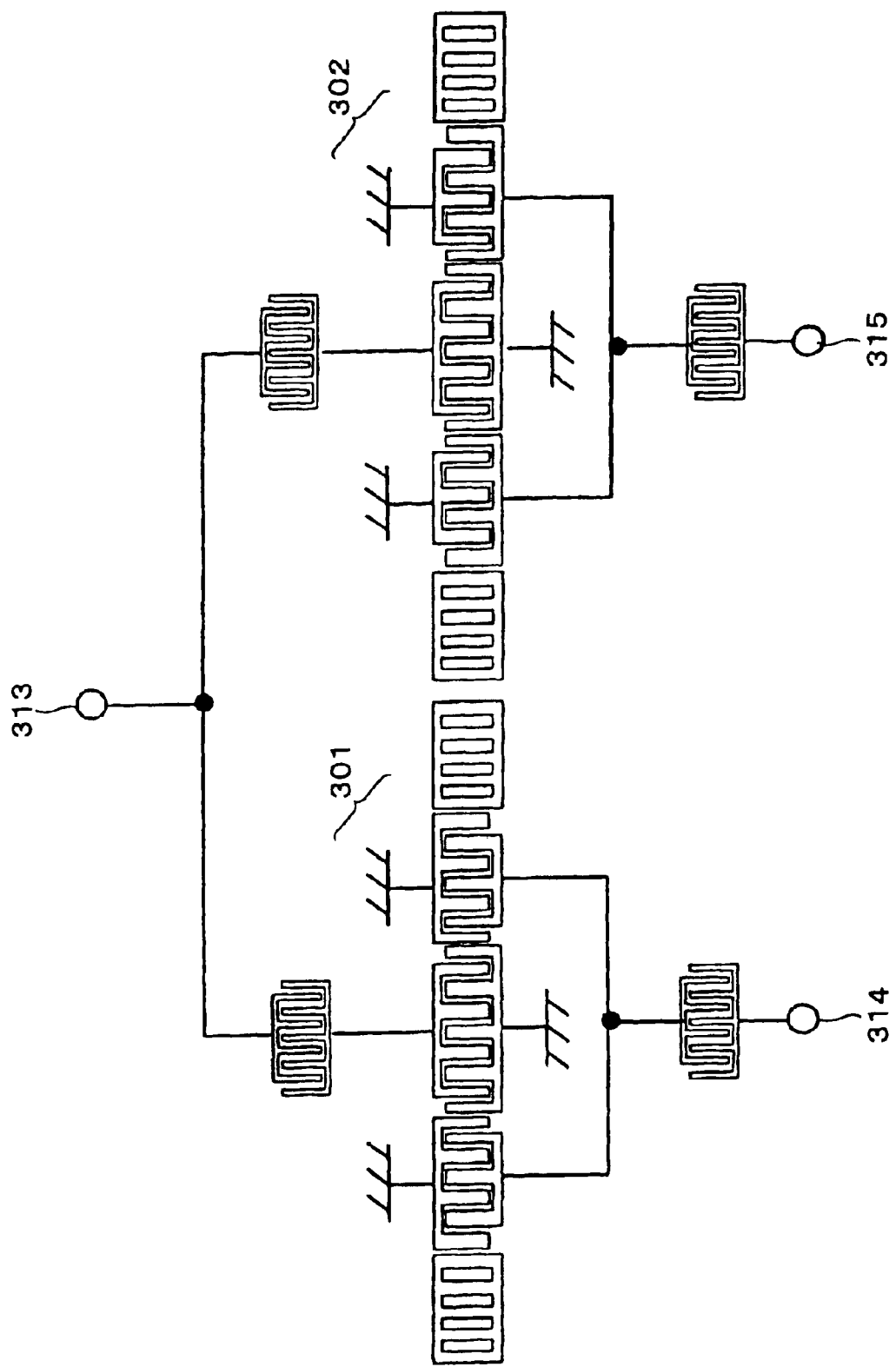
FIG. 21 schematically shows the configuration of another modification of the surface acoustic wave device of the second preferred embodiment of the present invention.
Figure 22:
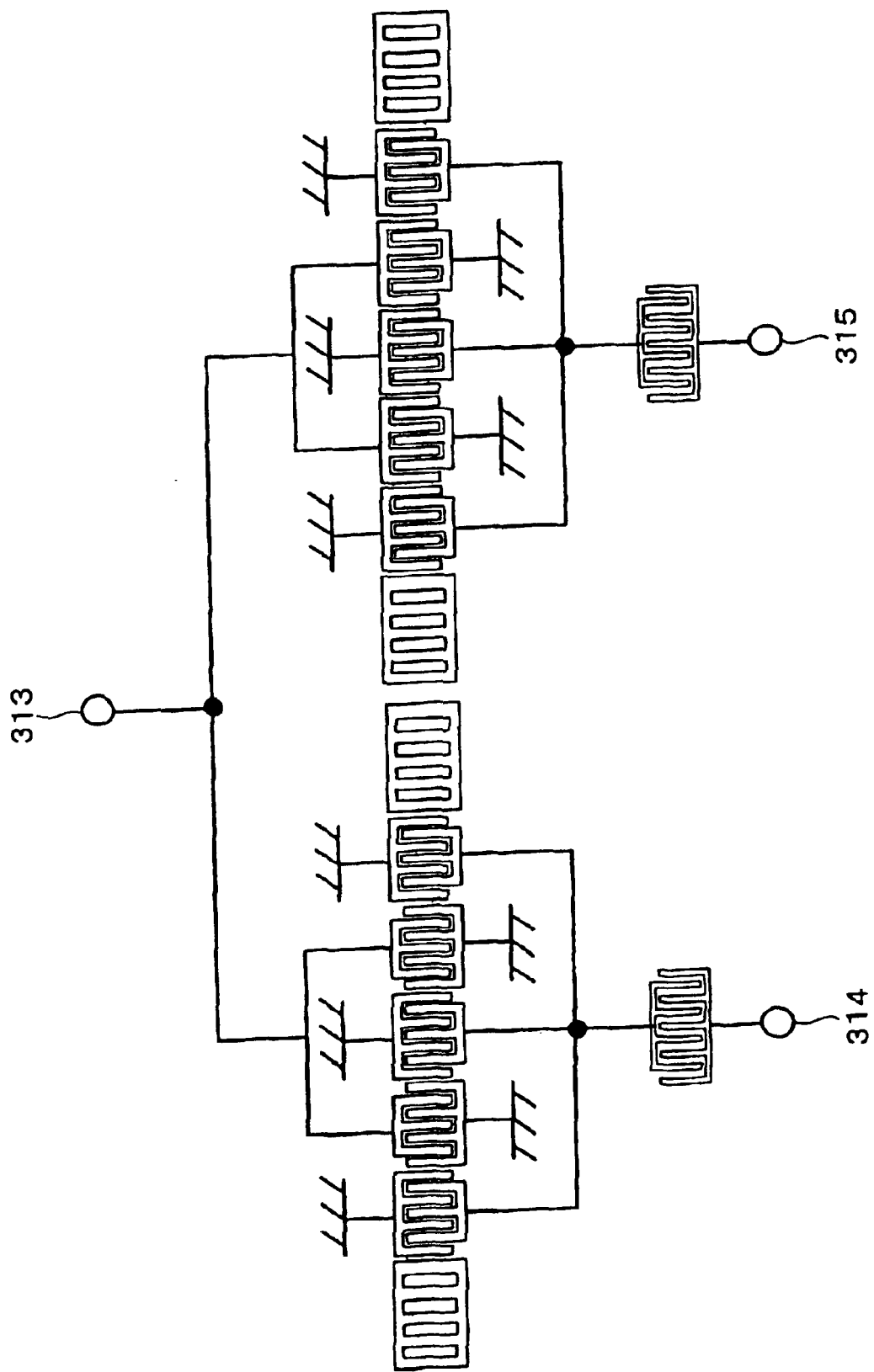
FIG. 22 schematically shows the configuration of still another modification of the surface acoustic wave device of the second preferred embodiment of the present invention.
Figure 23:
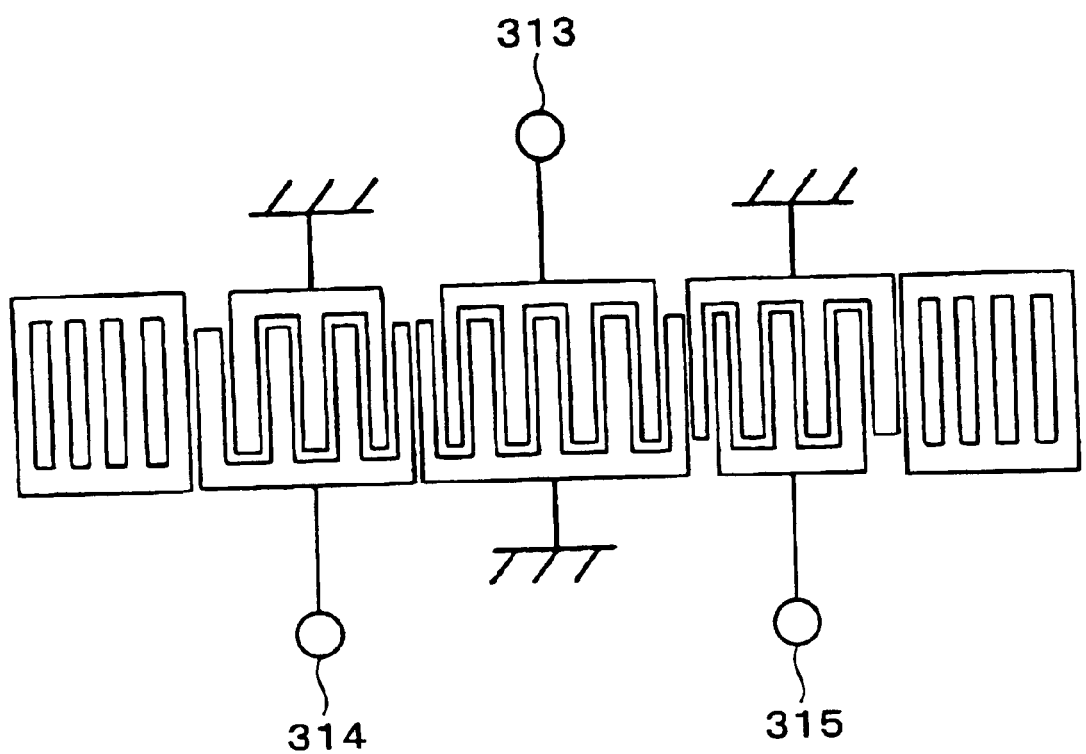
FIG. 23 schematically shows the configuration of another example of the surface acoustic wave device of the first preferred embodiment of the present invention.
Figure 24:
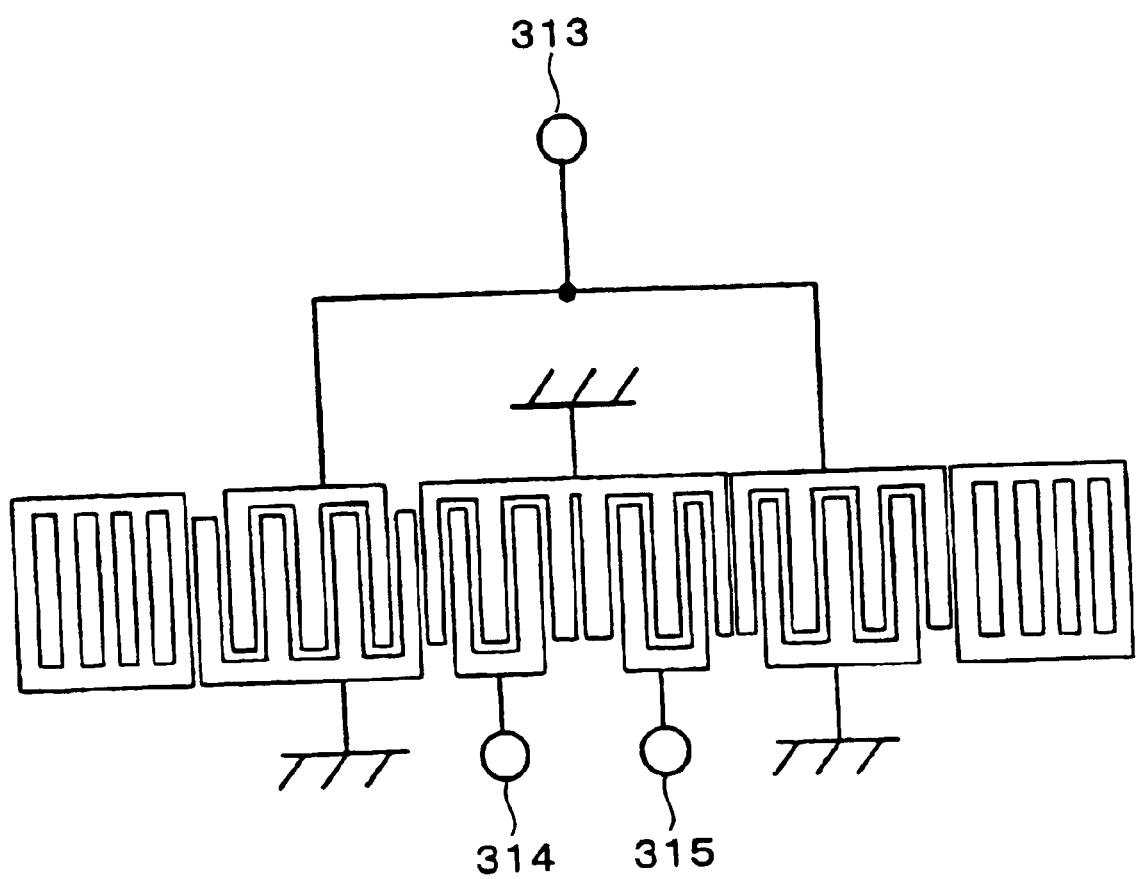
FIG. 24 schematically shows the configuration of still another example of the surface acoustic wave device of the first preferred embodiment of the present invention.

In this preferred embodiment, the surface acoustic wave resonators 431 and 432 are connected only on the balanced signal terminal side, respectively. However, the surface acoustic wave resonators may be connected on both the balanced-signal and unbalanced-signal sides, or a plurality of surface acoustic wave resonators may be connected, respectively. FIGS. 21 and 22 show other examples of this preferred embodiment, respectively.

Figure 25:
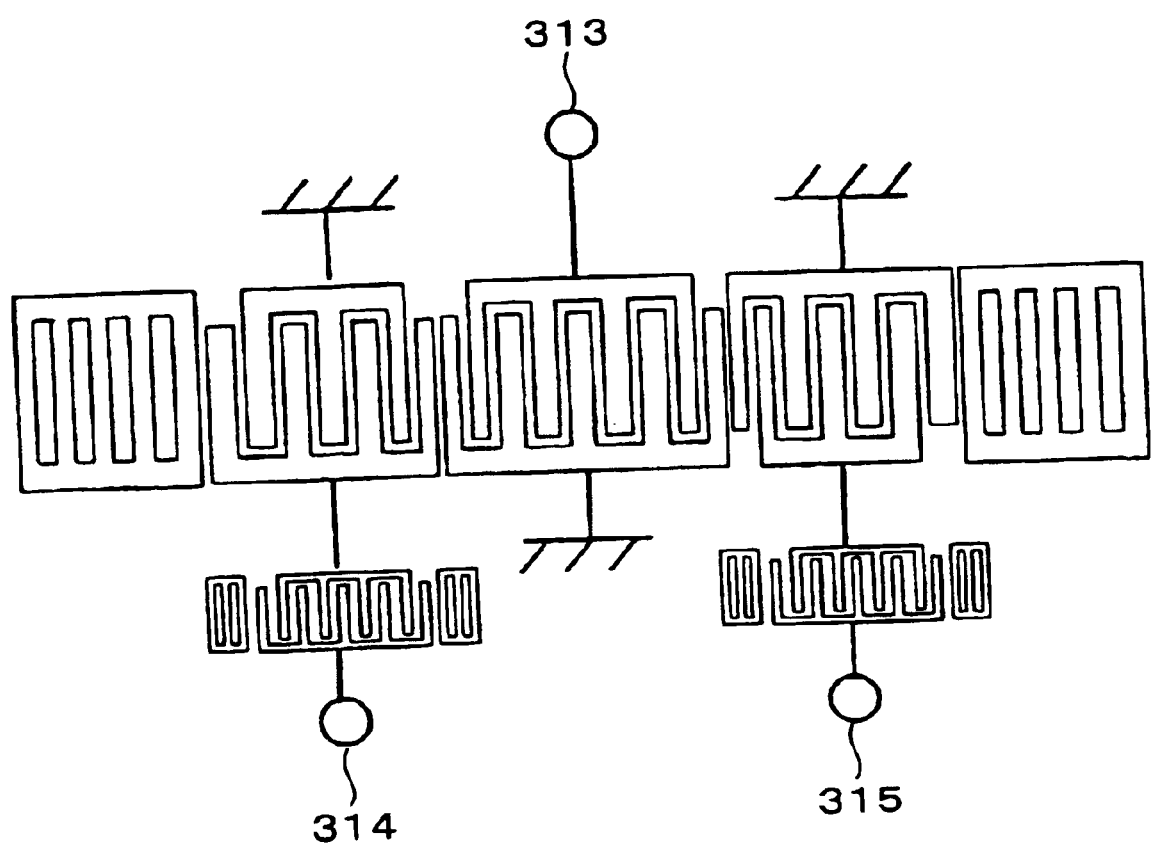
FIG. 25 schematically shows the configuration of still another example of the surface acoustic wave device of the second preferred embodiment of the present invention.
Figure 26:
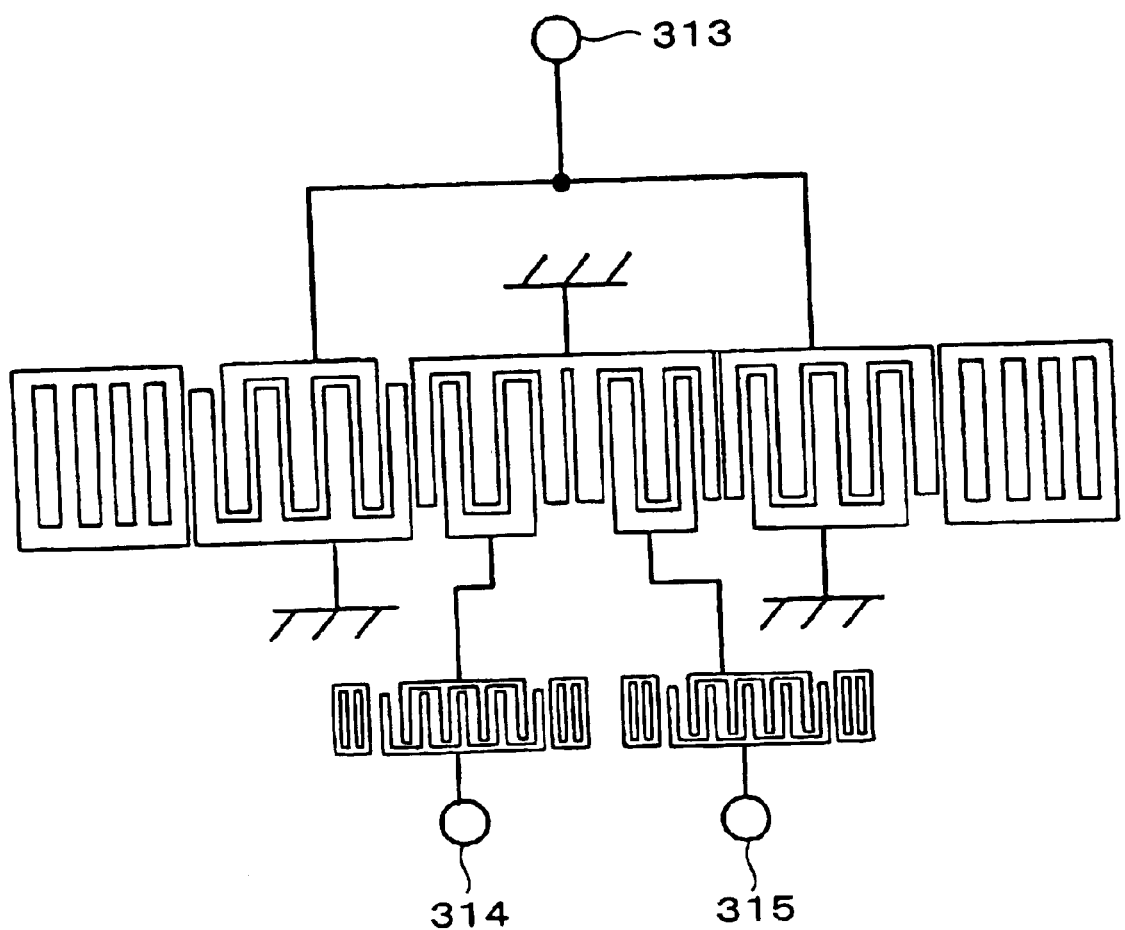
FIG. 26 schematically shows the configuration of still a further example of the surface acoustic wave device of the second preferred embodiment of the present invention.

Moreover, in the second preferred embodiment, the two surface acoustic wave filters are used. Surface acoustic wave devices each including one surface acoustic wave filter and having a balanced-unbalanced signal transformation function, shown in FIGS. 25 and 26, are also available.

As described above, according to the second preferred embodiment, a surface acoustic wave device having a balanced-unbalanced transforming function, of which the ratio of the impedances on the unbalanced and balanced terminal sides is about 1:2 or about 1:3, and having a characteristic with a sufficient attenuation outside of the pass band is provided by setting the ratio N1/N2 (N1 represents the total number of the electrode fingers of IDTs connected on the balanced signal terminal side, and N2 represents the total number of the electrode fingers of IDTs connected on the balanced signal terminal side) in the range of about 50% to about 70%, and the meshing width (W) of the electrodes of the IDTs is in the range of about 43 λ to about 58 λ (λI represents the wavelength of a surface acoustic wave, more preferably by configuring on the condition that the IDT-reflector gap is in the range of about 0.46 λr to about 0.54 λr, or the frequency ratio f ref/f idt is in the range of about 0.993 to about 1.003, and by electrically connecting at least one surface acoustic wave resonator in series with IDT which is connected to each of the balanced signal side terminals.

A communication device having the surface acoustic wave device of each of the above-described preferred embodiments provided therein will be described with reference to FIG. 27. A communication device 600 includes, on the receiver side for reception (Rx side), an antenna 601, an antenna common-use/RF Top filter 602, an amplifier 603, an Rx inter-stage filter 604, a mixer 605, a 1st IF filter 606, a mixer 607, a 2nd iF filter 608, an 1st plus 2nd local synthesizer 611, TCXO (temperature compensated crystal oscillator) 612, a divider 613, and a local filter 614.

Figure 27:
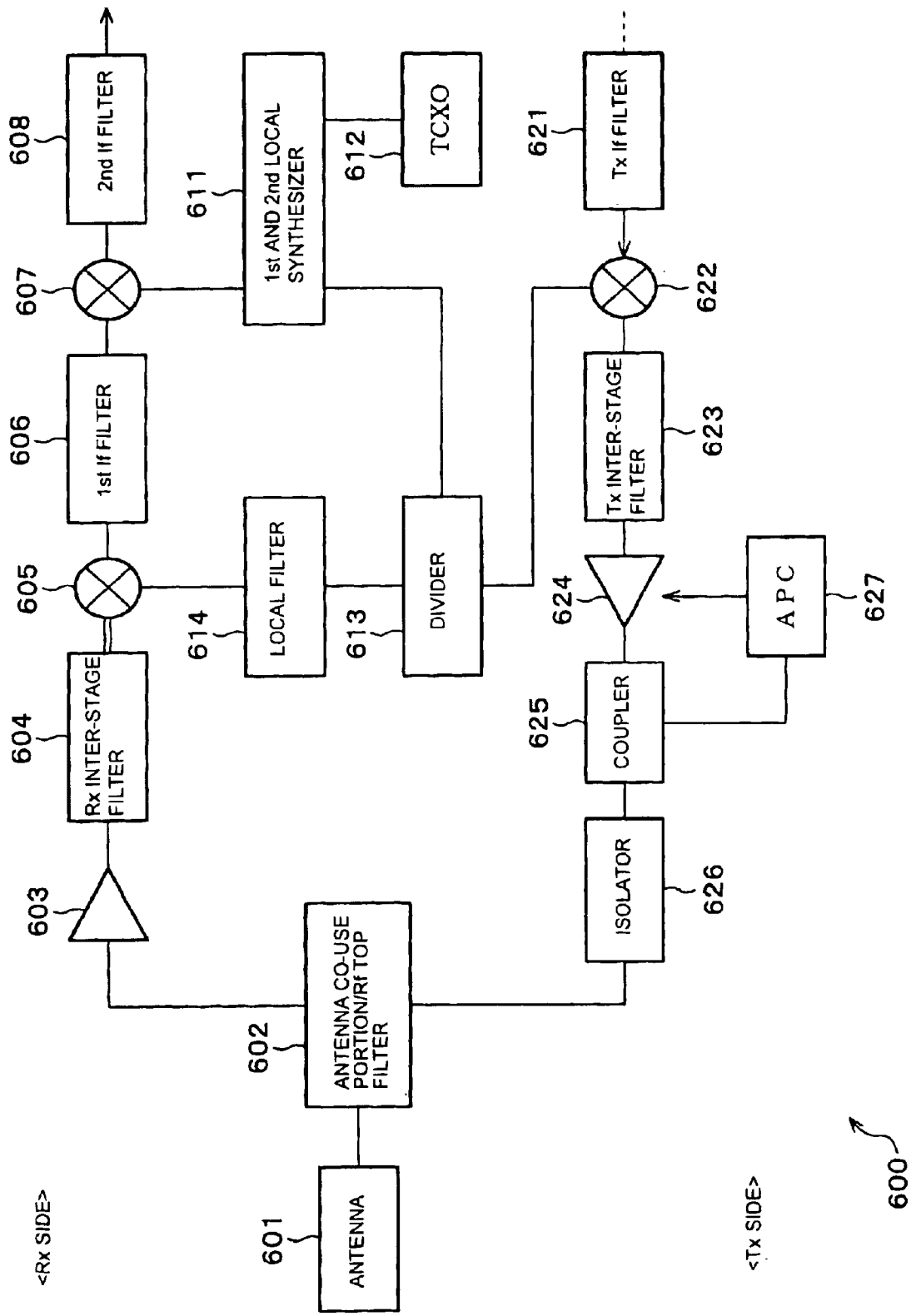
FIG. 27 is a circuit block diagram of the communication device of a preferred embodiment of the present invention.
Figure 28:
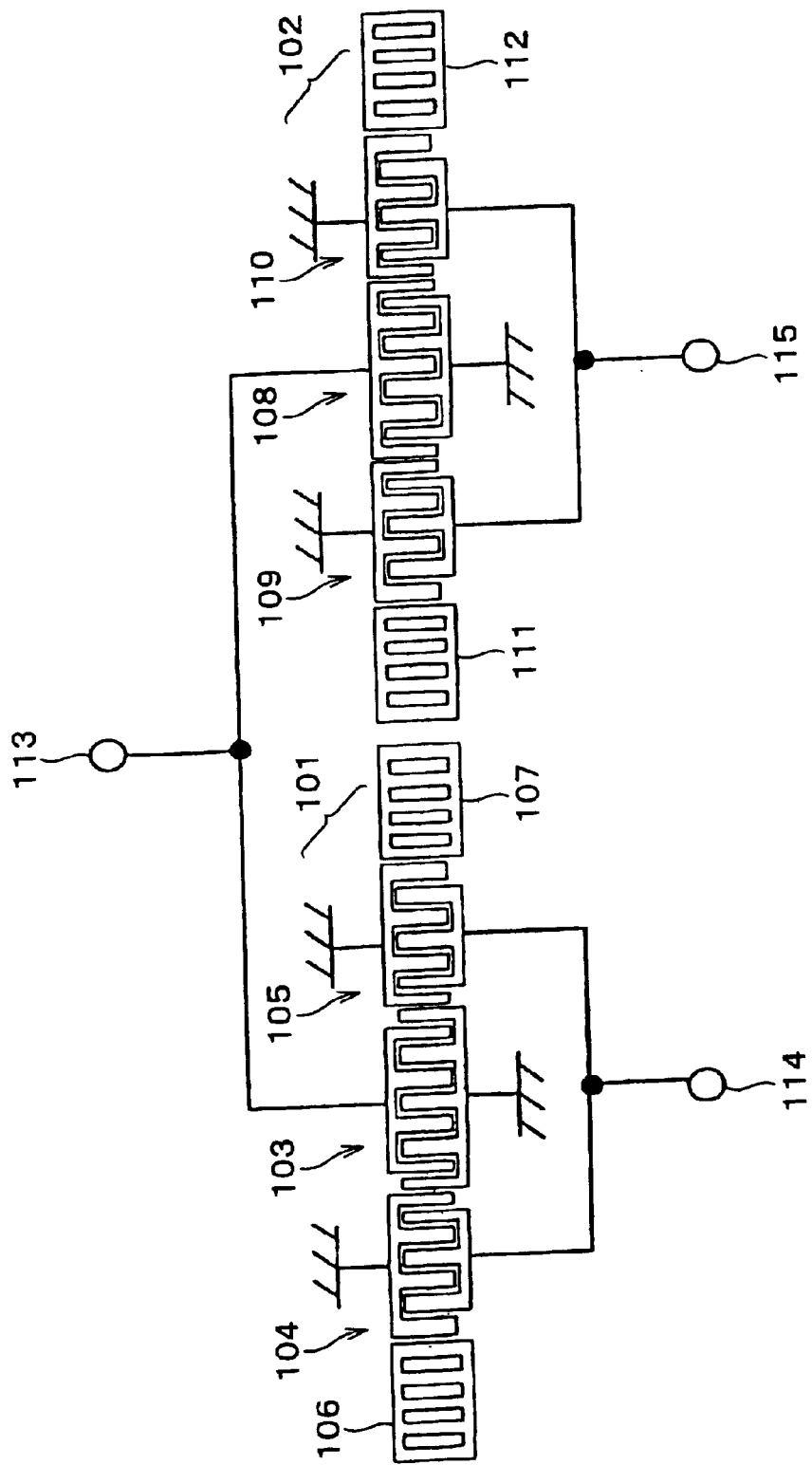
FIG. 28 schematically shows the configuration of a related art surface acoustic wave device corresponding to balanced-unbalanced input-output.
Figure 29:
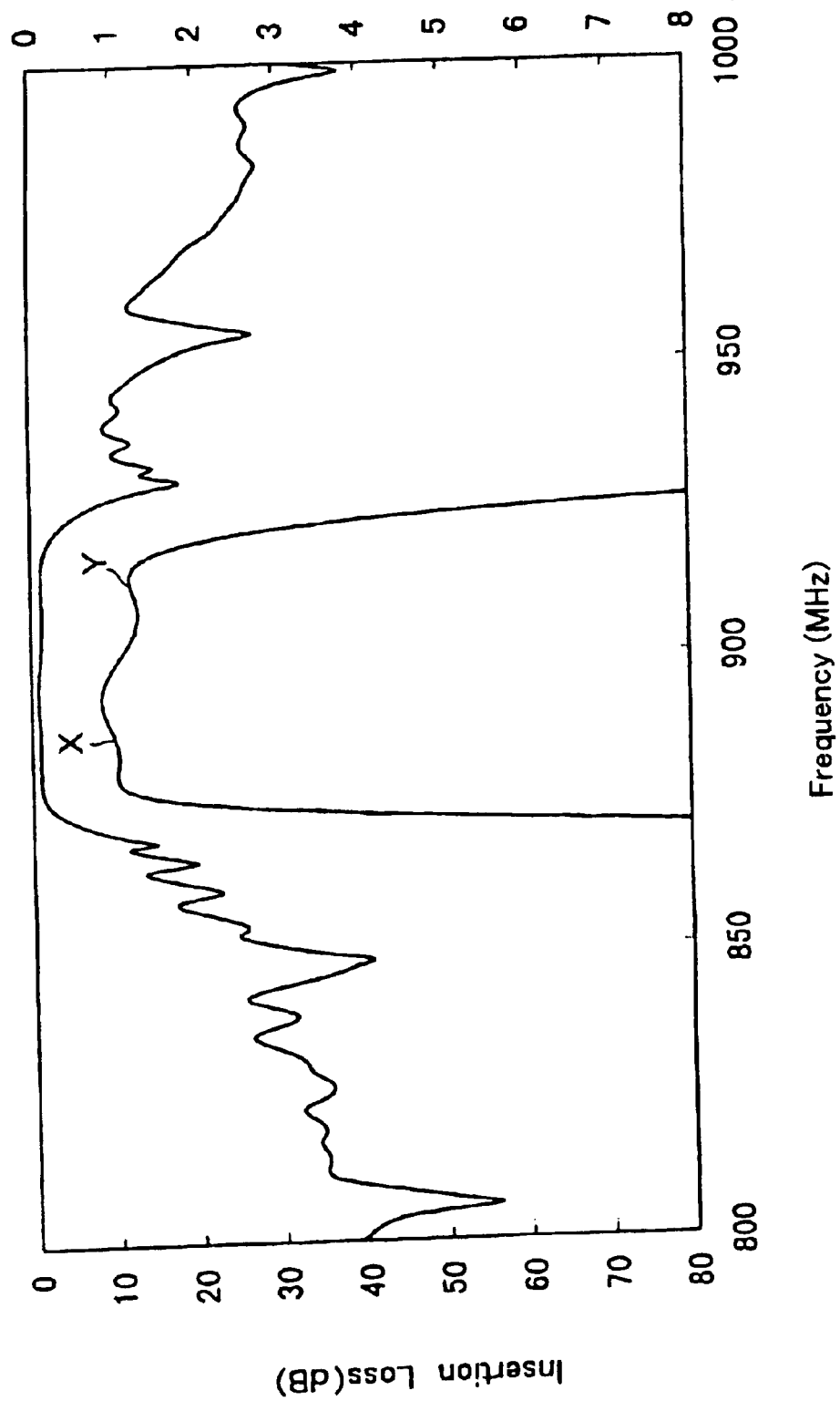
FIG. 29 is a graph showing the frequency characteristic of the related art surface acoustic wave device (an example in which the input-output impedances are about four-fold different from each other)
Figure 30B:
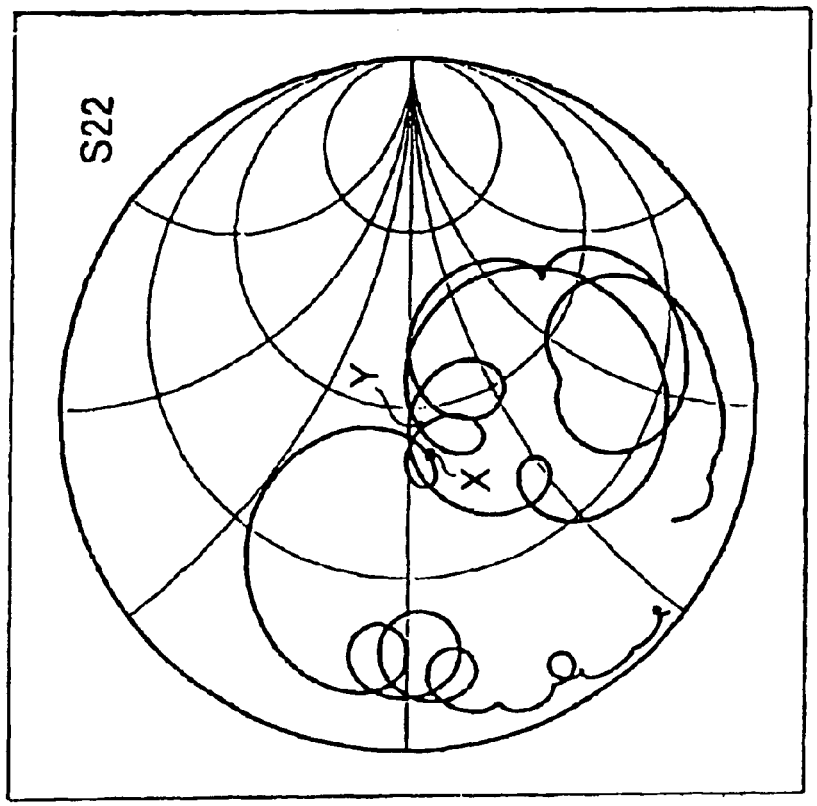
FIG. 30B is the same graph as that of FIG. 30A except that the standardized impedance is 200 Ω.
Figure 30A:
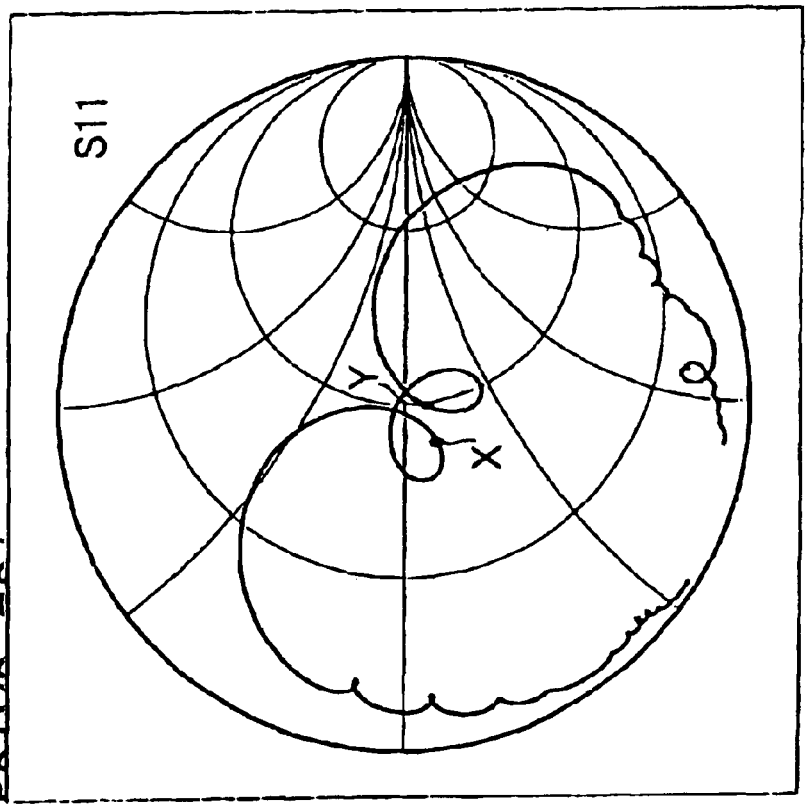
FIG. 30A is a graph showing the impedance characteristic of the related art surface acoustic wave device (an example in which the input-output impedances are about four-fold different from each other), obtained when the standardized impedance is 50 Ω.
Figure 31:
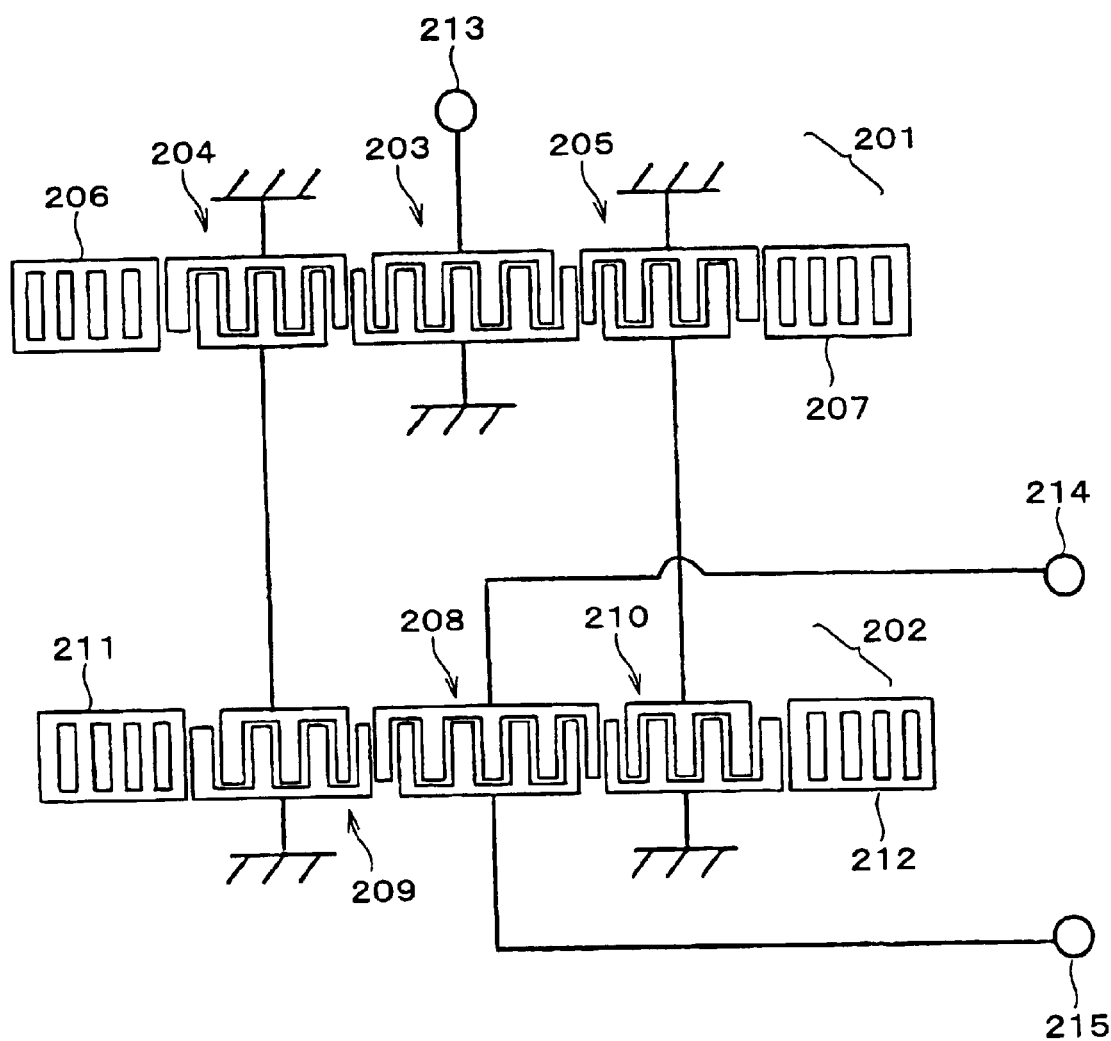
FIG. 31 schematically shows the configuration of another related art surface acoustic wave device in which the input-output impedances are different from each other.
Figure 32:
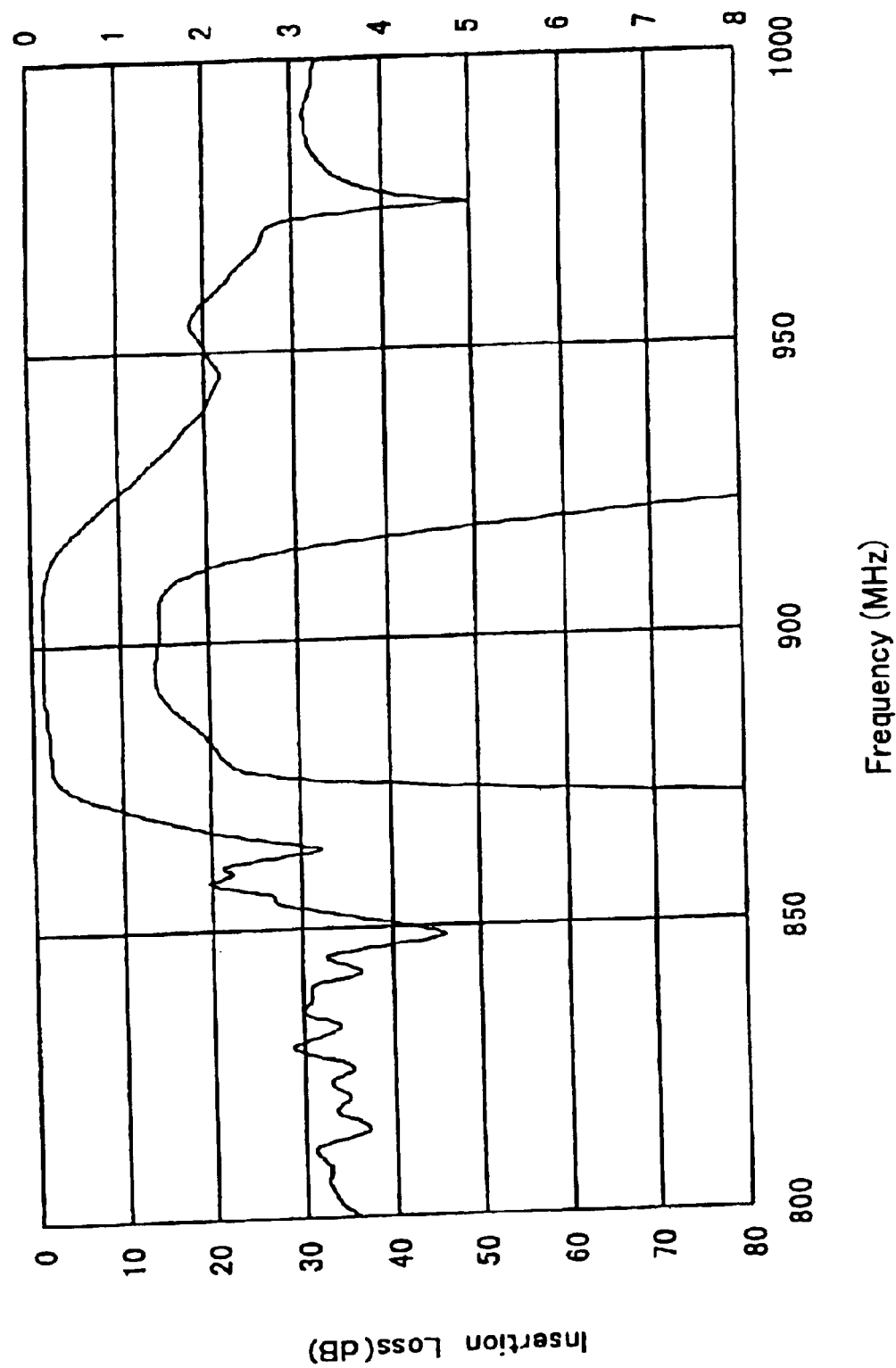
FIG. 32 is a graph showing the frequency characteristic of one surface acoustic wave filter which is used in the configuration of the FIG. 31.
Figure 33:
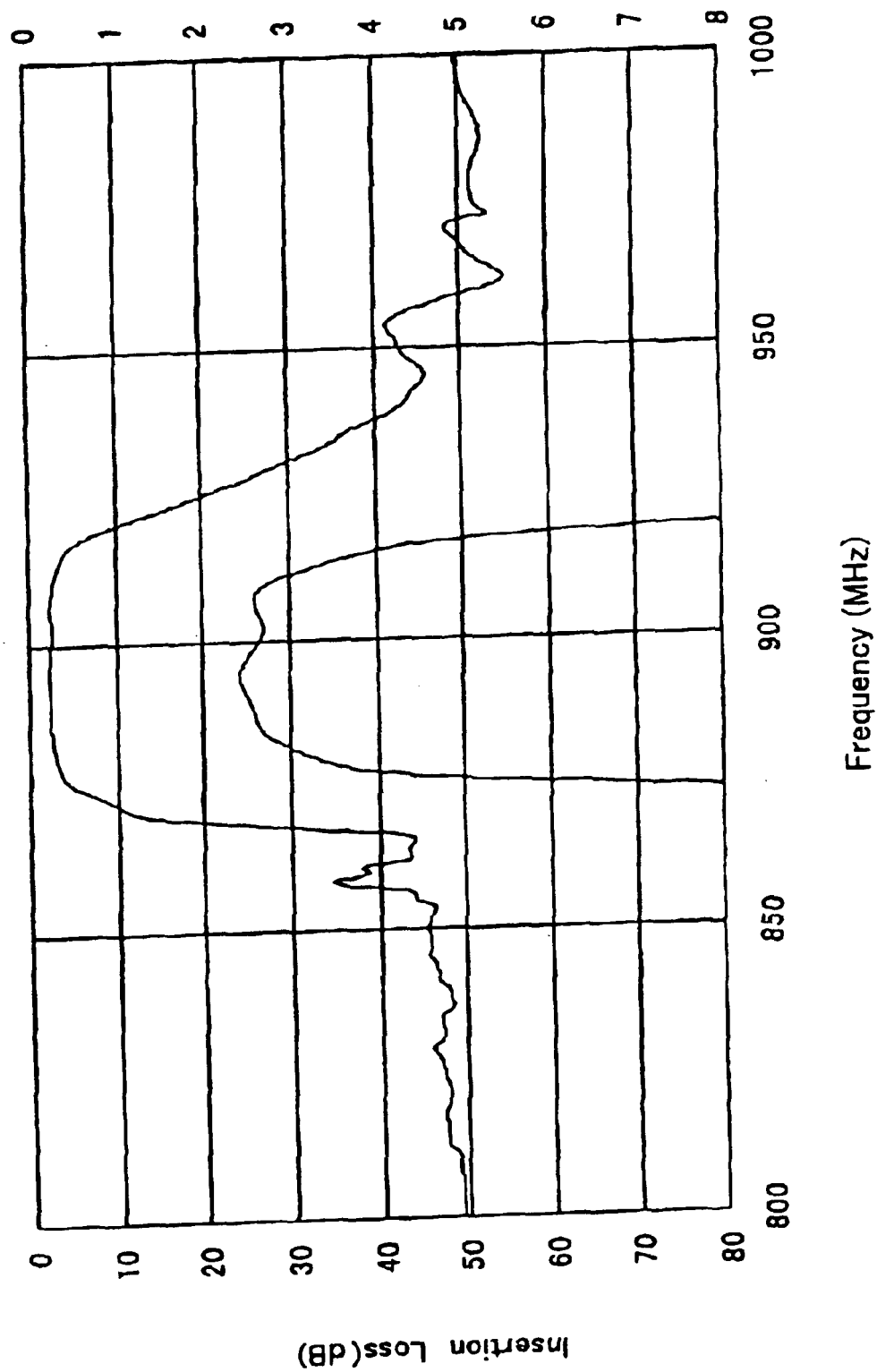
FIG. 33 is a graph showing the frequency characteristic of the surface acoustic wave device having the configuration of FIG. 31.
Figure 34:
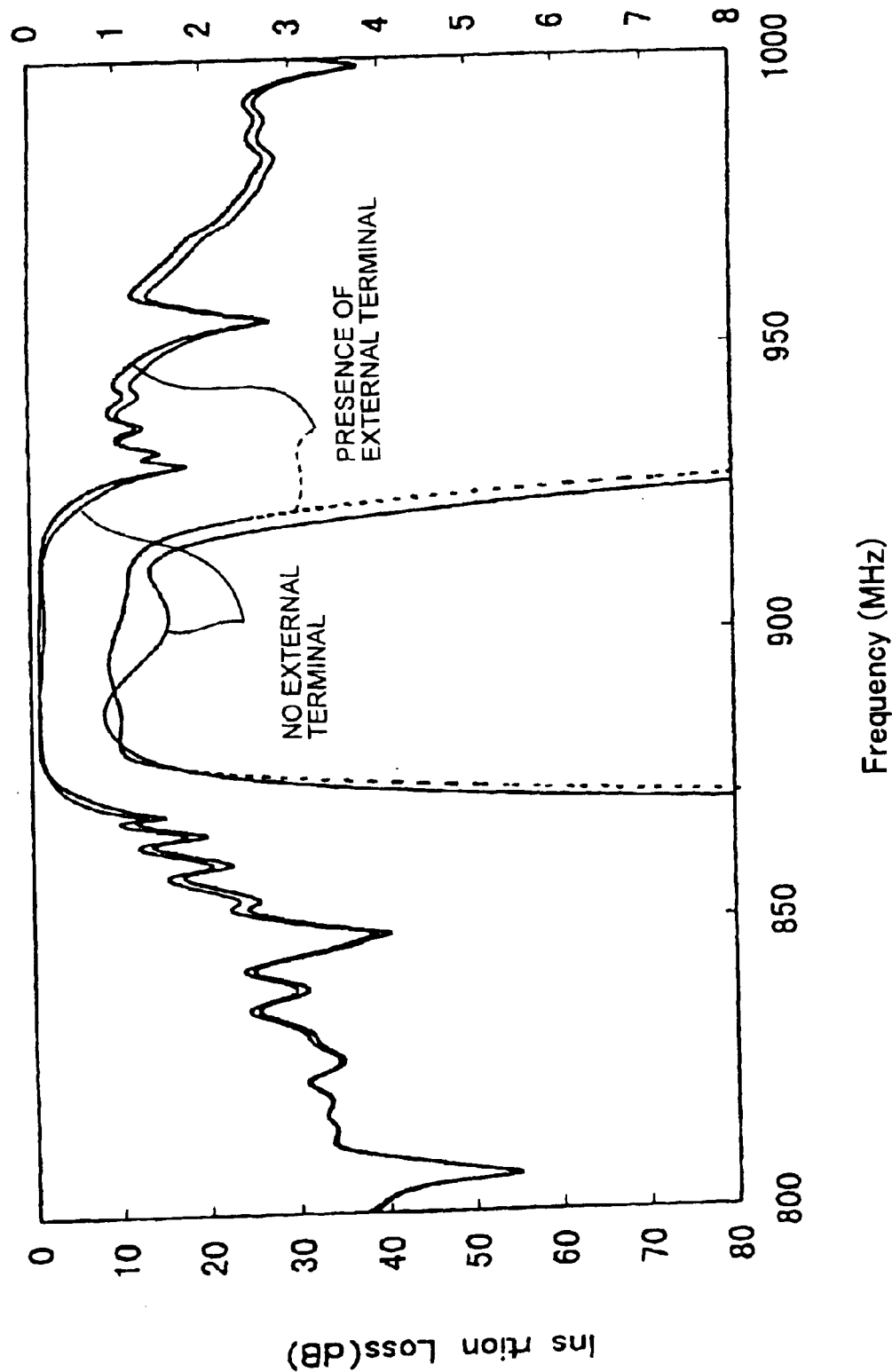
FIG. 34 is a graph showing the frequency characteristics of the another surface acoustic wave device (having an input impedance that is two times the output impedance as an example) and the device provided with an external element.
Figure 35B:
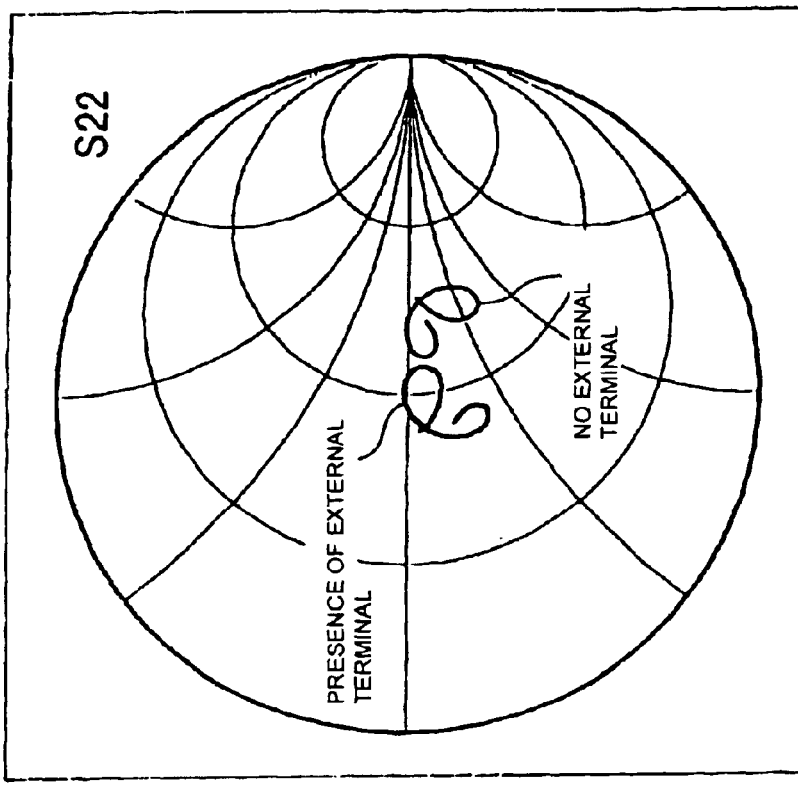
FIG. 35B is the same graph as that of FIG. 35A except that the standardized impedance is 100 Ω.
Figure 35A:
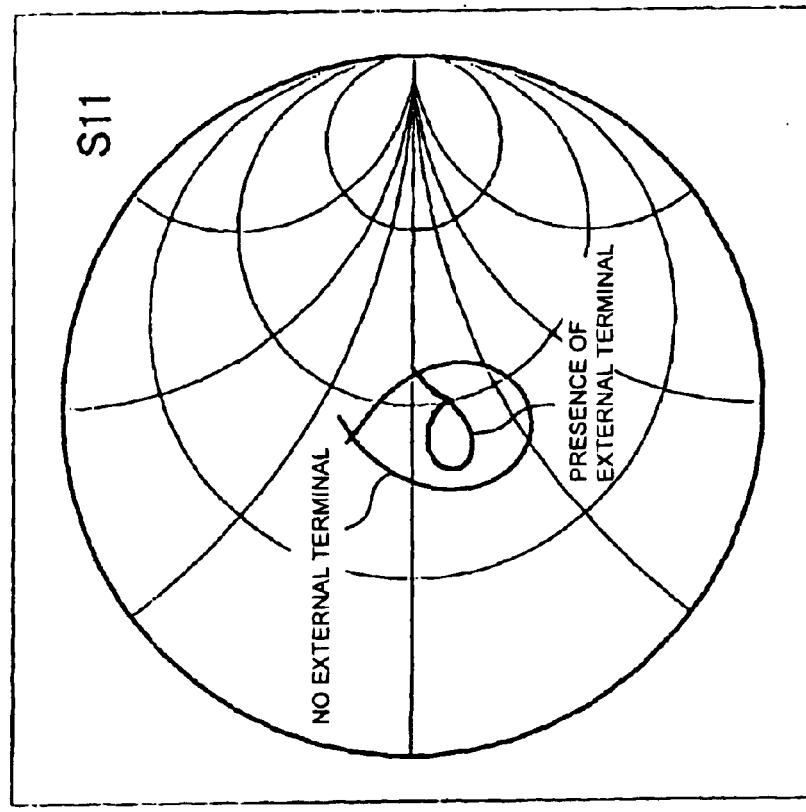
FIG. 35A is a graph showing the impedance characteristic of the another surface acoustic wave device (having an input impedance that is two times the output impedance as an example) and the device provided with an external element, obtained when the standardized impedance is 50 Ω.
Figure 36:
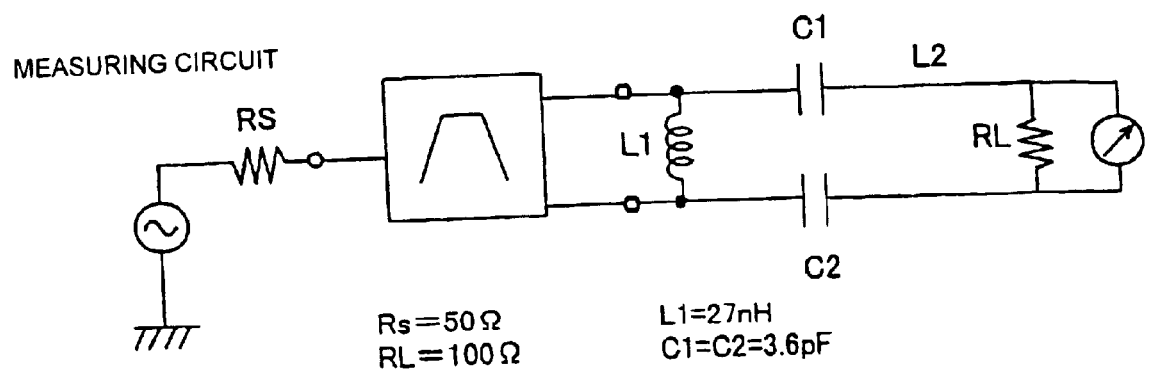
FIG. 36 is a circuit diagram of the related art surface acoustic wave device having the external element.

To stabilize the balancing property, preferably, balanced signals are transmitted from the Rx inter-stage filter 604 to the mixer 605 as represented by two lines in FIG. 27.

Moreover, the communication device 900 includes, on the transceiver side (Tx side), the antenna 601 and the antenna common-used portion/RF Top filter 602 which are also used on the receiver side, a Tx IF filter 621, a mixer 622, a Tx inter-stage filter 62, an amplifier 624, a coupler 625, an isolator 626, and APC (automatic power control) 627.

Preferably, the surface acoustic wave devices of the above-described preferred embodiments are used as the Rx inter-stage filter 604, the 1st IF filter 606, the Tx IF filter 621, and the Tx inter-stage filter 623.

The surface acoustic wave device of preferred embodiments of the present invention is provided with a filter function and also a balanced-unbalanced conversion function. Moreover, the ratio of the impedances on the unbalanced and balanced signal terminal sides is preferably about 1:2 or about 1:3. The device has a sufficient attenuation characteristic out of the pass band. Thus, the communication device of the present invention including the above-described surface acoustic wave devices has greatly improved transmission characteristics.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   only two surface acoustic wave elements; wherein
   each of the only two surface acoustic wave elements includes a plurality of interdigital electrode portions provided so as to have a balanced-unbalanced conversion function;
   a ratio N2/N1 is in the range of about 50% to about 70%, where N1 represents the total number of electrode fingers of one of said plurality of interdigital electrode portions that is connected with a balanced signal terminal side, and N2 represents the total number of electrode fingers of another one of said plurality of interdigital electrode portions that is connected with the unbalanced signal side; and
   a meshing width W of each of the plurality of interdigital electrode portions is in the range of about 43 λ to about 58 λ, where λ is the wavelength of a surface acoustic wave.

2. A surface acoustic wave device according to claim 1, wherein a distance between centers of adjacent electrode fingers at a location where a reflector and one of the plurality of interdigital electrode portions are adjacent to each other is about 0.46 λr to about 0.54 λr, wherein λr is the wavelength determined by an electrode period of the reflector.

3. A surface acoustic wave device according to claim 1, wherein a ratio f ref/f idt is in the range of about 0.993 to about 1.008, where f idt is a frequency determined by an electrode period of one of the plurality of interdigital electrode portions, and f ref is a frequency determined by an electrode period of a reflector.

4. A surface acoustic wave device according to claim 1, wherein the only two surface acoustic wave elements includes a first surface acoustic wave filter having an odd number of interdigital electrode portions that is at least three provided on a piezoelectric substrate along a propagation direction of a surface acoustic wave, and a second surface acoustic wave filter in which the phase of an input signal is different from that of an output signal by about 180°, in which a terminal on one side of each of the first and second surface acoustic wave filters is electrically connected in parallel to define an unbalanced signal terminal, and a terminal on the other side of each of the first and second acoustic wave filters is electrically connected in series to define a balanced signal terminal, whereby the device has a balanced-unbalanced conversion function.

5. A surface acoustic wave device according to claim 1, wherein [(k−1)/2] of said plurality of interdigital electrode portions are connected to the unbalanced signal terminal, and {[(k−1)/2]+1} of said plurality of interdigital electrode portions are connected to the balanced signal terminals.

6. A surface acoustic wave device according to claim 1, wherein the plurality of interdigital electrode portions are provided in a longitudinally coupled resonator type filter having three interdigital electrode portions.

7. A surface acoustic wave device according to claim 1, wherein the only two surface acoustic wave elements includes one surface acoustic wave filter provided on a piezoelectric substrate along a propagation direction of a surface acoustic wave and includes a first terminal at which the phase difference between an input signal and an output signal is about zero degrees and a second terminal at which the phase difference between an input signal and an output signal is about 180 degrees, and the first terminal and the second terminal are connected in series with each other, whereby the device has a balanced-unbalanced conversion function.

8. A surface acoustic wave device according to claim 1, wherein at least one surface acoustic wave resonator is connected in series with at least one of the plurality of interdigital electrode portions connected with the balanced-signal terminal side.

9. A surface acoustic wave device according to claim 6, wherein at least one surface acoustic wave resonator is electrically connected in series with a terminal connected to at least the interdigital electrode portions of the plurality of interdigital electrode portions located at both the ends so as to satisfy f1<f0<fN<f2, where in the resonance modes of each IDT, f0 is a zero-order mode excitation frequency, fN is an excitation frequency of a standing wave resonance mode having a peak in the intensity distribution of a surface acoustic wave between interdigital electrode portions, f1 is a resonance frequency of the surface acoustic wave resonator, and f2 is an anti-resonance frequency.

10. A surface acoustic wave device according to claim 1, wherein the ratio of the impedances on the unbalanced and balanced signal terminal sides is about 1:2 or about 1:3.

11. A communication device including the surface acoustic wave device defined in claim 1.

12. A surface acoustic wave device comprising:
   a plurality of interdigital electrode portions provided so as to have a balanced-unbalanced conversion function; wherein
   a ratio N2/N1 is in the range of about 50% to about 70%, where N1 represents the total number of electrode fingers of one of said plurality of interdigital electrode portions that is connected with a balanced signal terminal side, and N2 represents the total number of electrode fingers of another one of said plurality of interdigital electrode portions that is connected with the unbalanced signal side; and

[(k−1)/2] of said plurality of interdigital electrode portions are connected to the unbalanced signal terminal, and {[(k−1)/2]+1} of said plurality of interdigital electrode portions are connected to the balanced signal terminals.

13. A surface acoustic wave device according to claim 12, wherein the meshing width W of the plurality of interdigital electrode portions is in the range of about 43 λ to about 58 λ, where λ is the wavelength of a surface acoustic wave.

14. A surface acoustic wave device according to claim 12, wherein the distance between centers of adjacent electrode fingers at a location where a reflector and one of the plurality of interdigital electrode portions are adjacent to each other is about 0.46 λr to about 0.54 λr, wherein λr is the wavelength determined by an electrode period of the reflector.

15. A surface acoustic wave device according to claim 12, wherein a ratio f ref/f idt is in the range of about 0.993 to about 1.008, where f idt is a frequency determined by an electrode period of one of the plurality of interdigital electrode portions, and f ref is a frequency determined by an electrode period of a reflector.

16. A surface acoustic wave device according to claim 12, wherein the surface acoustic wave device includes a first surface acoustic wave filter having an odd number of interdigital electrode portions that is at least three provided on a piezoelectric substrate along a propagation direction of a surface acoustic wave, and a second surface acoustic wave filter in which the phase of an input signal is different from that of an output signal by about 180°, in which a terminal on one side of each of the first and second surface acoustic wave filters is electrically connected in parallel to define an unbalanced signal terminal, and a terminal on the other side of each of the first and second acoustic wave filters is electrically connected in series to define a balanced signal terminal, whereby the device has a balanced-unbalanced conversion function.

17. A surface acoustic wave device according to claim 12, wherein one surface acoustic wave filter is provided on a piezoelectric substrate along a propagation direction of a surface acoustic wave and includes a first terminal at which the phase difference between an input signal and an output signal is about zero degrees and a second terminal at which the phase difference between an input signal and an output signal is about 180 degrees, and the first terminal and the second terminal are connected in series with each other, whereby the device has a balanced-unbalanced conversion function.

18. A surface acoustic wave device according to claim 12, wherein the plurality of interdigital electrode portions are provided in a longitudinally coupled resonator type filter having three interdigital electrode portions.

19. A surface acoustic wave device according to claim 12, wherein at least one surface acoustic wave resonator is connected in series with at least one of the plurality of interdigital electrode portions connected with the balanced-signal terminal side.

20. A surface acoustic wave device according to claim 18, wherein at least one surface acoustic wave resonator is electrically connected in series with a terminal connected to at least the interdigital electrode portions of the plurality of interdigital electrode portions located at both the ends so as to satisfy f1<f0<fN<f2, where in the resonance modes of each IDT, f0 is a zero-order mode excitation frequency, fN is an excitation frequency of a standing wave resonance mode having a peak in the intensity distribution of a surface acoustic wave between interdigital electrode portions, f1 is a resonance frequency of the surface acoustic wave resonator, and f2 is an anti-resonance frequency.

21. A surface acoustic wave device according to claim 12, wherein the ratio of the impedances on the unbalanced and balanced signal terminal sides is about 1:2 or about 1:3.

22. A communication device including the surface acoustic wave device defined in claim 12.

* * * * *